United States Patent
Choi

(10) Patent No.: US 12,261,192 B2
(45) Date of Patent: Mar. 25, 2025

(54) DISPLAY DEVICE

(71) Applicant: Samsung Display Co., LTD., Yongin-si (KR)

(72) Inventor: Ji Woong Choi, Gwangmyeong-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 490 days.

(21) Appl. No.: 17/560,352

(22) Filed: Dec. 23, 2021

(65) Prior Publication Data
US 2022/0223645 A1 Jul. 14, 2022

(30) Foreign Application Priority Data

Jan. 12, 2021 (KR) .......................... 10-2021-0003722

(51) Int. Cl.
| | |
|---|---|
| *H01L 27/15* | (2006.01) |
| *H01L 33/24* | (2010.01) |
| *H01L 33/38* | (2010.01) |
| *H01L 33/44* | (2010.01) |

(52) U.S. Cl.
CPC ............ *H01L 27/156* (2013.01); *H01L 33/24* (2013.01); *H01L 33/38* (2013.01); *H01L 33/44* (2013.01)

(58) Field of Classification Search
CPC .. H10K 50/00–88; H10K 2102/00–361; H01L 27/15; H01L 33/24; H01L 33/38
See application file for complete search history.

(56) References Cited

U.S. PATENT DOCUMENTS

| | | | |
|---|---|---|---|
| 2018/0019369 A1* | 1/2018 | Cho | ......................... H01L 33/38 |
| 2022/0093828 A1* | 3/2022 | Kwag | .................. H01L 27/156 |

FOREIGN PATENT DOCUMENTS

| | | |
|---|---|---|
| KR | 10-0996374 | 11/2010 |
| KR | 10-1730977 | 4/2017 |
| KR | 10-2018-0007376 | 1/2018 |
| KR | 10-2020-0063380 | 6/2020 |

* cited by examiner

*Primary Examiner* — Evren Seven
*Assistant Examiner* — Cole Leon Lindsey
(74) *Attorney, Agent, or Firm* — KILE PARK REED & HOUTTEMAN PLLC

(57) ABSTRACT

A display device includes a first electrode disposed on a substrate; a second electrode disposed on the substrate, the second electrode being spaced apart from, and facing, the first electrode in a first direction; and a plurality of light-emitting elements extending in a length direction and having both ends disposed on the first electrode and second electrode, respectively, wherein the first electrode includes a plurality of first patterns which are recessed from a top surface of the first electrode and from a side surface of the first electrode that faces the second electrode, and the second electrode includes a plurality of second patterns which are recessed from a top surface of the second electrode and from a side surface of the second electrode that faces the first electrode.

19 Claims, 17 Drawing Sheets

110: BML
120: ACT
130: GE
140: SD1, SD2
150: VL1, VL2, CDP
TR: ACT, GE, SD1, SD2
400: 410, 420

DISPLAY DEVICE

CROSS-REFERENCE TO RELATED APPLICATION

This application claims priority to and the benefit of Korean Patent Application No. 10-2021-0003722 under 35 U.S.C. § 119, filed in the Korean Intellectual Property Office (KIPO) on Jan. 12, 2021, the entire contents of which are incorporated herein by reference.

BACKGROUND

1. Technical Field

The disclosure relates to a display device.

2. Description of the Related Art

Display devices have increasingly become of importance with the development of multimedia, and various types of display devices, such as an organic light-emitting diode (OLED) display device, a liquid crystal display (LCD) device, or the like, have been used.

A display device, which is a device for displaying an image, includes a display panel such as an OLED display panel or an LCD panel. The display panel may include light-emitting elements such as light-emitting diodes (LEDs), and the LEDs may be classified into OLEDs using an organic material as a light-emitting material and inorganic LEDs (ILEDs) using an inorganic material as a light-emitting material.

SUMMARY

Embodiments of the disclosure provide a display device capable of improving the reliability of an alignment process.

However, embodiments of the disclosure are not restricted to those set forth herein. The above and other embodiments of the disclosure will become more apparent to one of ordinary skill in the art to which the disclosure pertains by referencing the detailed description of the disclosure given below.

According to an embodiment of the disclosure, a display device includes a first electrode disposed on a substrate; a second electrode disposed on the substrate, the second electrode being spaced apart from, and facing, the first electrode in a first direction; and a plurality of light-emitting elements extending in a length direction and having both end portions thereof disposed on the first and second electrodes. The first electrode includes a plurality of first patterns which are recessed from a top surface of the first electrode and from a side surface of the first electrode that faces the second electrode, and the second electrode includes a plurality of second patterns which are recessed from a top surface of the second electrode and from a side surface of the second electrode that faces the first electrode.

The first electrode may extend in a second direction which intersects the first direction, the plurality of first patterns may be disposed to be spaced apart from one another in the second direction, the second electrode may extend in the second direction, and the plurality of second patterns may be disposed to be spaced apart from one another in the second direction.

Each of the plurality of first patterns may be disposed to correspond to each of the plurality of second patterns, respectively, and each of the plurality of first patterns may face a corresponding one of the plurality of the second patterns in the first direction.

A diameter of each of the plurality of light-emitting elements may be smaller than a width of each of the plurality of first patterns in the second direction and a width of each of the plurality of second patterns in the second direction.

The width of each of the plurality of first patterns in the second direction may be equal to a width of a corresponding one of the plurality of second patterns in the second direction.

A distance between the plurality of first patterns adjacent in the second direction may be uniform, and a distance between the plurality of second patterns adjacent in the second direction may be uniform.

The distance between the plurality of first patterns may be equal to the distance between the plurality of second patterns.

A width of each of the plurality of first patterns in the first direction may be smaller than a width of each of the first electrode in the first direction, and a width of the plurality of second patterns in the first direction may be smaller than a width of the second electrode in the first direction.

Each of the plurality of first patterns may include sidewalls which extend from the top surface and from the side surface of the first electrode and by a bottom surface which extends from the side surface of the first electrode, and may be connected to the sidewalls of a corresponding one of the plurality of first patterns, each of the plurality of second patterns may include sidewalls which extend from the top surface and from the side surface of the second electrode and by a bottom surface which extends from the side surface of the second electrode, and may be connected to the sidewalls of a corresponding one of the plurality of second patterns, and the sidewalls of each of the plurality of first patterns may face the sidewalls of each of the plurality of second patterns.

The sidewalls of each of the plurality of first patterns may be inclined with respect to a bottom surface of the corresponding one of the plurality of first patterns, and the sidewalls of each of the plurality of second patterns may be inclined with respect to a bottom surface of the corresponding one of the plurality of second patterns.

The sidewalls of each of the plurality of first patterns may include a first sidewall which extends from the top surface and the side surface of the first electrode, a second sidewall which faces the first sidewall of the corresponding of the plurality of first patterns, and a third sidewall which extends from the top surface of the first electrode and connects the first and second sidewalls of the corresponding one of the plurality of first patterns. The sidewalls of each of the plurality of second patterns may include a first sidewall which extends from the top surface and the side surface of the second electrode, a second sidewall which faces the first sidewall of the corresponding one of the second patterns, and a third sidewall which extends from the top surface of the second electrode and connects the first and second sidewalls of the corresponding one of the plurality of second patterns. The third sidewall of each of the plurality of first patterns may be spaced apart from, and face, the third sidewall of each of the plurality of second patterns in the first direction.

A distance between the third sidewall of each of the plurality of first patterns and the third sidewall of each of the plurality of second patterns may be greater than a length of each of the plurality of light-emitting elements in the length direction.

A distance between the first sidewall of each of the plurality of first patterns and the second sidewall of each of the plurality of first patterns may be greater than a diameter of each of the plurality of light-emitting elements, and a distance between the first sidewall of each of the plurality of second patterns and the second sidewall of each of the plurality of second patterns may be greater than the diameter of each of the plurality of light-emitting elements.

A first end portion of each of the plurality of light-emitting elements may be disposed on the bottom surface of each of the plurality of first patterns, and a second end portion of each of the plurality of light-emitting elements may be disposed on the bottom surface of each of the plurality of second patterns.

The display device may further include a first insulating layer disposed on the first and second electrodes. The plurality of light-emitting elements may be disposed on the first insulating layer.

A thickness of each of the plurality of first patterns may be smaller than a thickness of the first electrode, and a thickness of each of the plurality of second patterns may be smaller than a thickness of the second electrode.

The thickness of each of the plurality of first patterns and the thickness of each of the plurality of second patterns may be smaller than a diameter of each of the plurality of light-emitting elements.

The plurality of light-emitting elements may include first light-emitting elements having both ends disposed on the plurality of first patterns and the plurality of second patterns, respectively.

The first light-emitting elements may be disposed to correspond one-to-one to the plurality of first patterns and to the plurality of second patterns.

The plurality of light-emitting elements may include second light-emitting elements having both ends disposed on the top surface of the first electrode and the top surface of second electrode, respectively.

According to the aforementioned and other embodiments of the disclosure, as a plurality of engraved patterns are formed to be recessed from the top surfaces and side surfaces of first and second electrodes, which are used to align a plurality of light-emitting elements, the light-emitting elements can be induced over to the engraved patterns, and as a result, the reliability of the alignment of the light-emitting elements can be improved.

Other features and embodiments may be apparent from the following detailed description, the drawings, and the claims.

It should be noted that the effects of the disclosure are not limited to those described above, and other effects of the disclosure will be apparent from the following description.

BRIEF DESCRIPTION OF THE DRAWINGS

The above and other embodiments and features of the disclosure will become more apparent by describing in detail embodiments thereof with reference to the attached drawings, in which.

DETAILED DESCRIPTION OF THE EMBODIMENTS

The disclosure will now be described more fully hereinafter with reference to the accompanying drawings, in which embodiments of the disclosure are shown. This disclosure may, however, be embodied in different forms and should not be construed as limited to the embodiments set forth herein. Rather, these embodiments are provided so that this disclosure will be more thorough and complete, and will convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," and the like may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

It will be understood that the terms "contact," "connected to," and "coupled to" may include a physical and/or electrical contact, connection or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Embodiments of the disclosure will hereinafter be described with reference to the accompanying drawings.

Figure 1:
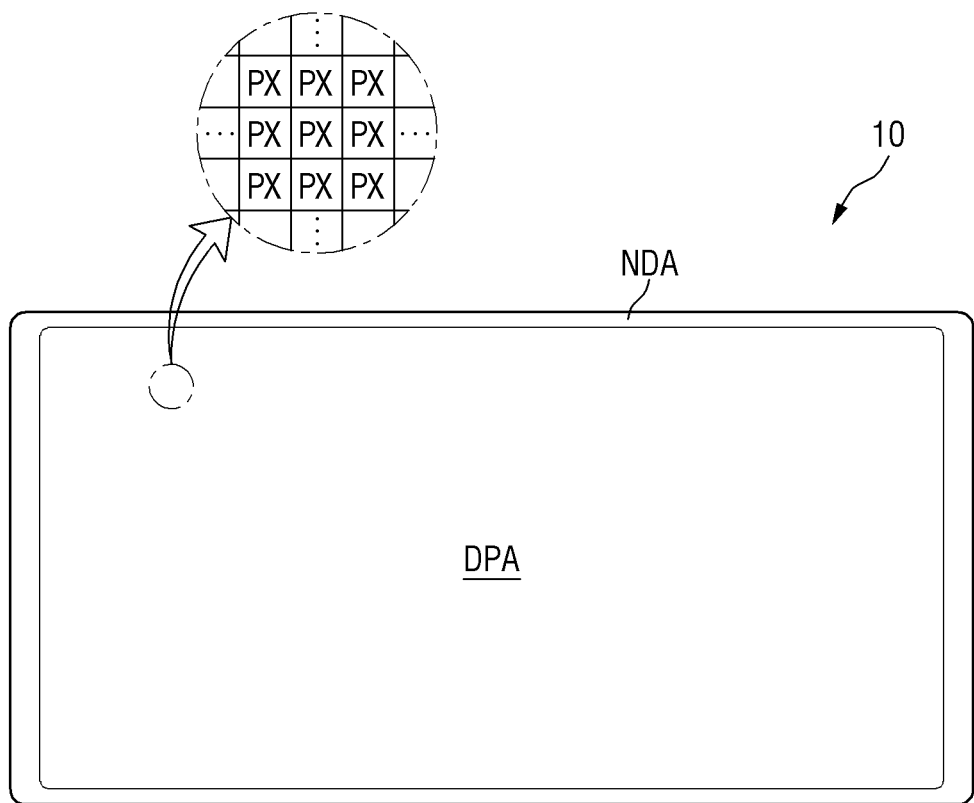
FIG. 1 is a schematic plan view of a display device according to an embodiment of the disclosure.

FIG. 1 is a schematic plan view of a display device according to an embodiment.

Referring to FIG. 1, a display device 10 displays a moving or still image. The display device 10 may refer to nearly all types of electronic devices that provide a display screen. Examples of the display device 10 may include a television (TV), a laptop computer, a monitor, a billboard, an Internet-of-Things (IoT) device, a mobile phone, a smartphone, a tablet personal computer (PC), an electronic watch, a smartwatch, a watchphone, a head-mounted display, a mobile communication terminal, an electronic notepad, an electronic book, a portable multimedia player (PMP), a navigation device, a gaming console, a digital camera, and a camcorder.

The display device 10 may include a display panel that provides a display screen. Examples of the display panel may include an inorganic light-emitting diode (ILED) display panel, an organic light-emitting diode (OLED) display panel, a quantum-dot light-emitting diode (QLED) display panel, a plasma display panel (PDP), and a field emission display (FED) panel. The display panel of the display device 10 will hereinafter be described as being an ILED display panel, but the disclosure is not limited thereto. Other display panels may be used as the display panel of the display device 10 as long as the same technical concept may be applied thereto.

First, second, and third directions DR1, DR2, and DR3 are defined as illustrated in the accompanying drawings. Specifically, the first and second directions DR1 and DR2 may be directions that are perpendicular to each other within a same plane. The third direction DR3 may be a direction that is perpendicular to the plane defined by the first and second directions DR1 and DR2. The third direction DR3 may be perpendicular to each of the first and second directions DR1 and DR2. The third direction DR3 refers to the thickness direction (or display direction) of the display device 10.

The display device 10 may have a rectangular shape that is longer in the first direction DR1 than in the second direction DR2 in a plan view. The corners at which the long sides and the short sides of the display device 10 meet may be right-angled, but the disclosure is not limited thereto. As another example, the corners at which the long sides and the short sides of the display device 10 meet may be rounded. However, the planar shape of the display device 10 is not particularly limited but may vary. The display device 10 may have various shapes other than a rectangular shape, such as a square shape, a rectangular shape with rounded corners, a non-tetragonal polygonal shape, or a circular shape.

The display surface of the display device 10 may be disposed on a side, in the third direction DR3 (or thickness direction), of the display device 10. Unless specified otherwise, the terms "above" and "top," as used herein, refer to a side, in the third direction DR3 (or the display direction), of the display device 10), and the term "top surface," as used herein, refers to a surface that is directed to the third direction DR3. Also, unless specified otherwise, the terms "below" and "bottom," as used herein, refer to another side, in the opposite direction of the third direction DR3 (or the opposite direction of the display direction), of the display device 10), and the term "bottom surface," as used herein, refers to a surface that is directed to the opposite direction of the third direction DR3. Also, unless specified otherwise, the terms "left," "right," "upper," and "lower," as used herein, refer to their respective directions as viewed from above the display device 10. For example, the term "right" refers to the first direction DR1, the term "left" refers to the opposite direction of the first direction DR1, the term "upper" refers to the second direction DR2, and the term "lower" refers to the opposite direction of the second direction DR2.

The display device 10 may include a display area DPA and a non-display area NDA. The display area DPA is an area in which an image is displayed, and the non-display area NDA is an area in which a screen is not displayed.

The shape of the display area DPA may conform to the shape of the display device 10. For example, the display area DPA may have a similar shape to the display device 10, e.g., a rectangular shape, in a plan view. The display area DPA may generally account for the middle part of the display device 10.

The display area DPA may include pixels PX. The pixels PX may be arranged in row and column directions. The pixels PX may have a rectangular or square shape in a plan view. In an embodiment, each of the pixels PX may include light-emitting elements that are formed of inorganic particles.

The non-display area NDA may be disposed around the display area DPA. The non-display area NDA may surround the entire display area DPA or part of the display area DPA. The non-display area NDA may form the bezel of the display device 10.

Figure 2:
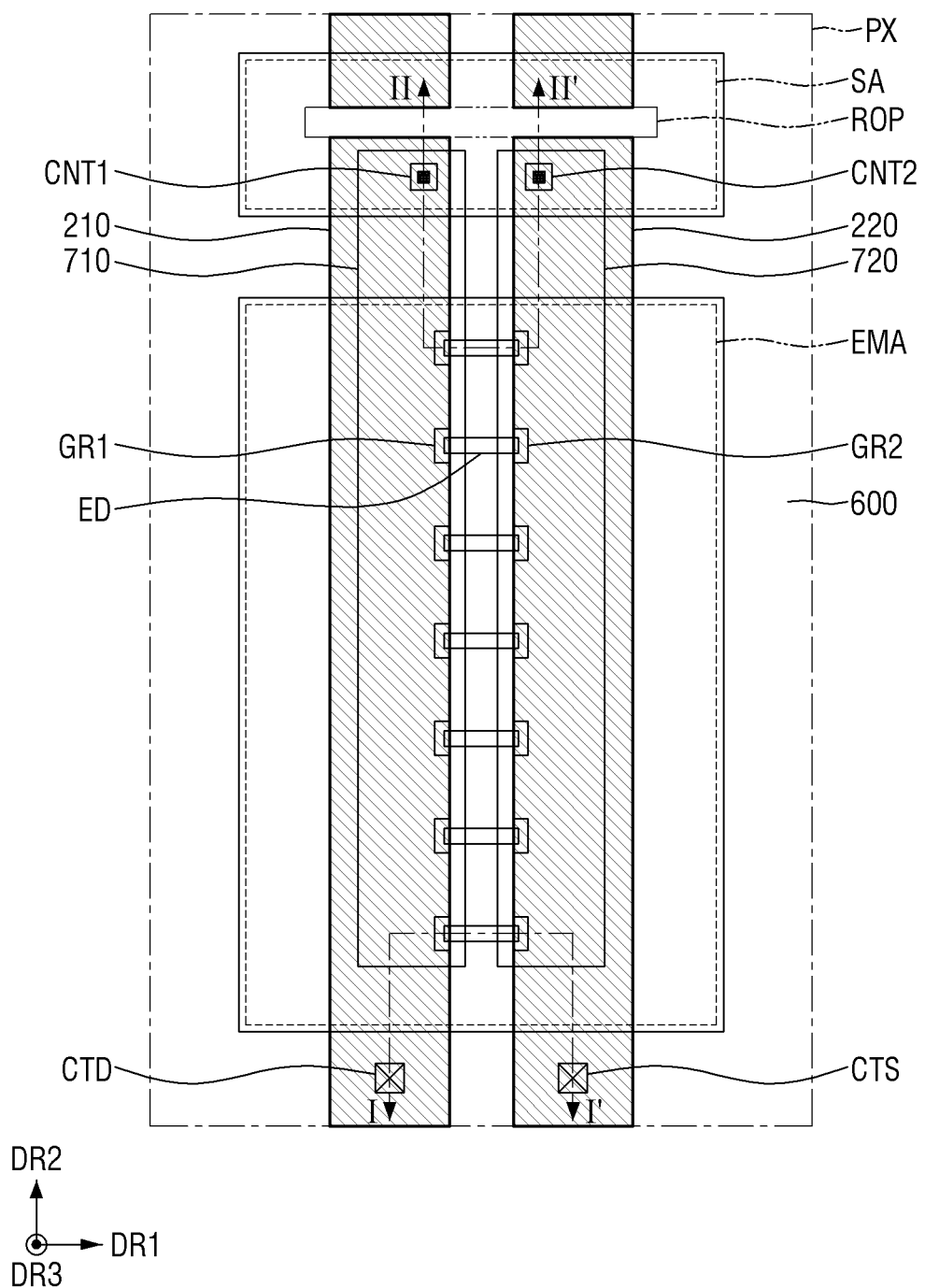
FIG. 2 is a schematic plan view of a pixel of the display device of FIG. 1.

FIG. 2 is a schematic plan view of a pixel of the display device of FIG. 1.

Referring to FIG. 2, a pixel PX of the display device 10 may include an emission area EMA and a non-emission area. The emission area EMA may be defined as a region that outputs light emitted by light-emitting elements ED, and the non-emission area may be defined as a region that is not reached by light emitted by the light-emitting elements ED and thus does not output light.

The emission area EMA may include a region where the light-emitting elements ED are disposed and a region around the region where the light-emitting elements ED are disposed. The emission area EMA may further include a region that outputs light emitted by the light-emitting elements ED and then reflected or refracted by other elements.

The pixel PX may include a subarea SA, which is disposed in the non-emission area. The light-emitting elements ED may not be disposed in the subarea SA. The subarea SA may be disposed above the emission area EMA (or on a first side of the emission area EMA in the second direction DR2), in the pixel PX. The subarea SA may be disposed between the emission area EMA and another emission area EMA of a neighboring pixel PX adjacent to the pixel PX in the second direction DR2. The subarea SA may include a region where first and second electrodes 210 and 220 are electrically connected to first and second contact electrodes 710 and 720 through first and second contact holes CNT1 and CNT2, respectively, which penetrate a first insulating layer 510 (see FIG. 3).

The subarea SA may include a separation part ROP. The separation part ROP of the subarea SA may be a region where the first and second electrodes 210 and 220 are separated from first and second electrodes 210 and 220 of the neighboring pixel PX.

The pixel PX may include the first and second electrodes 210 and 220, the light-emitting elements ED, a first bank 600, and the first and second contact electrodes 710 and 720.

The arrangement of multiple elements in a pixel PX will hereinafter be described.

The first bank 600 may be disposed along the boundaries of the pixel PX to separate the pixel PX from other pixels PX. Also, the first bank 600 may be disposed to surround the emission area EMA and the subarea SA and to separate the emission area EMA and the subarea SA. The first bank 600 may be formed to have a greater height than a second bank 400 in a cross-sectional view and may thus allow ink having the light-emitting elements ED dispersed therein to be sprayed onto the emission area EMA without being mixed with other neighboring pixels PX, during inkjet printing for aligning the light-emitting elements ED.

In a plan view, the first bank 600 may include parts that extend in the first direction DR1 and parts that extend in the second direction DR2 and may thus be arranged in a lattice pattern.

The first electrode 210 may extend in the second direction DR2. The first electrode 210 may extend in the second direction DR2 and may be disposed in and across the emission area EMA and the subarea SA. For example, the first electrode 210 may be disposed on a left side of the pixel PX in a plan view. The first electrode 210 may extend in the second direction DR2 and may be separated from the first electrode 210 of the neighboring pixel PX, in the separation part ROP of the subarea SA.

The second electrode 220 may extend in the second direction DR2. The second electrode 220 may be disposed to be spaced apart from the first electrode 210 in the first direction DR1. The first and second electrodes 210 and 220 may be spaced apart from, and face, each other in the first direction DR1.

The second electrode 220 may extend in the second direction DR2 and may be disposed in and across the emission area EMA and the subarea SA. For example, the second electrode 220 may be disposed on a right side of the pixel PX in a plan view. The second electrode 220 may extend in the second direction DR2 and may be separated from the second electrode 220 of the neighboring pixel PX, in the separation part ROP of the subarea SA.

The first and second electrodes 210 and 220 may be electrically connected to a circuit element layer CCL (see FIG. 3) through the first and second electrode contact holes CTD and CTS, respectively. The first and second electrodes 210 and 220 may be electrically connected to the circuit element layer CCL through the first and second electrode contact holes CTD and CTS, respectively, and may thus transmit electrical signals to the light-emitting elements ED.

The first and second electrodes 210 and 220 may be used as alignment lines for applying alignment signals during the alignment of the light-emitting elements ED in a process of fabricating the display device 10. For example, the light-emitting elements ED may be aligned by an electric field generated between the first and second electrodes 210 and 220 in response to alignment signals applied to the first and second electrodes 210 and 220, so that both end portions of each of the light-emitting elements ED may be placed on the first and second electrodes 210 and 220.

In an embodiment, patterns for guiding the alignment of the light-emitting elements ED may be formed on each of the first and second electrodes 210 and 220, which are used in aligning the light-emitting elements ED, so that both end portions of each of the light-emitting elements ED may be respectively mounted on the first and second electrodes 210 and 220.

Specifically, the first electrode 210 may include first patterns GR1, which are recessed from the top surface of the first electrode 210 and a side surface of the first electrode 210 that faces the second electrode 220. For example, the first patterns GR1 may be recessed from the right side surface and the top surface of the first electrode 210, in a plan view. The second electrode 220 may include second patterns GR2, which are recessed from the top surface of the second electrode 220 and a side surface of the second electrode 220 that faces the first electrode 210. For example, the second patterns GR2 may be recessed from the left side surface and the top surface of the second electrode 220. The first patterns GR1 and the second patterns GR2 will be described below.

The light-emitting elements ED may extend in a direction. The light-emitting elements ED may be arranged so that both end portions of each of the light-emitting elements ED may be placed on the first and second electrodes 210 and 220. The light-emitting elements ED may be spaced apart from one another in the second direction DR2, i.e., in the direction in which the first and second electrodes 210 and 220 extend, and may be aligned substantially parallel to each other. In an embodiment, the light-emitting elements ED may be arranged so that both end portions of each of the light-emitting elements ED may be placed on the first and second electrodes 210 and 220 having the first patterns GR1 and the second patterns GR2 respectively formed thereon.

The first contact electrode 710 may be disposed on the first electrode 210. The first contact electrode 710 may extend in the second direction DR2. The first contact electrode 710 may electrically contact the first electrode 210 and first end portions of the light-emitting elements ED. Specifically, the first contact electrode 710 may electrically contact the first electrode 210 through the first contact hole CNT1, which exposes the top surface of the first electrode 210, in the subarea SA, and may electrically contact the first end portions of the light-emitting elements ED disposed on the first patterns GR1, in the emission area EMA. The first contact electrode 710 may electrically connect the first electrode 210 and the light-emitting elements ED.

The second contact electrode 720 may be disposed on the second electrode 220. The second contact electrode 720 may extend in the second direction DR2. The second contact electrode 720 may electrically contact the second electrode 220 and second end portions of the light-emitting elements ED. The second contact electrode 720 may electrically contact the second electrode 220 through the second contact hole CNT2, which exposes the top surface of the second electrode 220, in the subarea SA, and may electrically contact the second end portions of the light-emitting elements ED disposed on the second patterns GR2, in the emission area EMA. The second contact electrode 720 may electrically connect the second electrode 220 and the light-emitting elements ED.

The second contact electrode 720 may be spaced apart from the first contact electrode 710 in the first direction DR1. The first and second contact electrodes 710 and 720 may be electrically insulated from each other.

Figure 3:
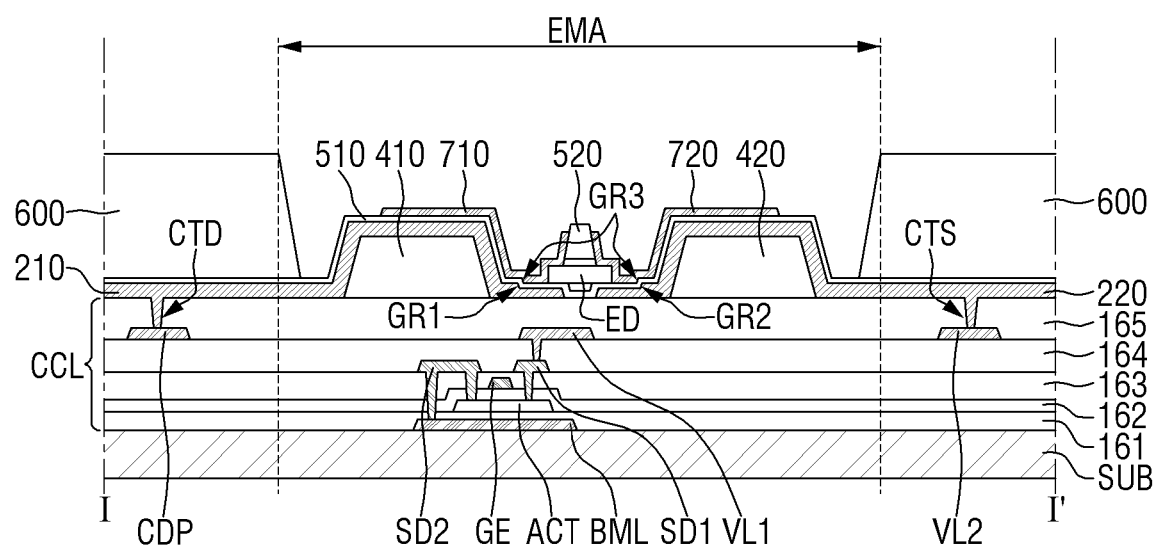
FIG. 3 is a schematic cross-sectional view taken along line I-I' of FIG. 2.
Figure 4:
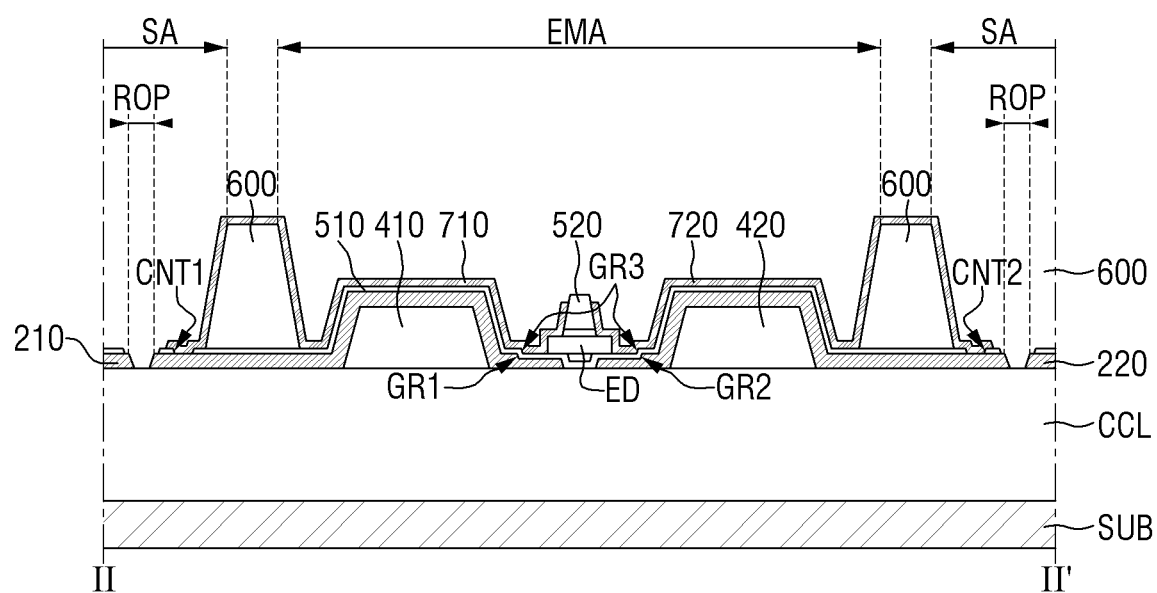
FIG. 4 is a schematic cross-sectional view taken along line II-IF of FIG. 2.

FIG. 3 is a schematic cross-sectional view taken along line I-I' of FIG. 2. FIG. 4 is a schematic cross-sectional view taken along line II-IF of FIG. 2.

Referring to FIGS. 3 and 4, the display device 10 may include a substrate SUB, the circuit element layer CCL disposed on the substrate SUB, and a display element layer that includes the first bank 600, the light-emitting elements ED, the first and second electrodes 210 and 220, the second bank 400, the first and second contact electrodes 710 and 720, and insulating layers, which are disposed on the circuit element layer CCL.

The substrate SUB may be an insulating substrate. The substrate SUB may be formed of an insulating material such as glass, quartz, or a polymer resin. The substrate SUB may be a rigid substrate or may be a flexible substrate that is bendable, foldable, or rollable.

The circuit element layer CCL may be disposed on the substrate SUB. The circuit element layer CCL may include conductive layers, at least one transistor TR, insulating films, and first and second voltage lines VL1 and VL2.

A lower metal layer 110 may be disposed on the substrate SUB. The lower metal layer 110 may include a first light blocking pattern BML. The first light blocking pattern BML, may be a light blocking layer that protects an active layer ACT of the transistor TR. The first light blocking pattern BML may be disposed below the transistor TR to cover (or overlap) the channel region of the active layer ACT of the transistor TR, from below the transistor TR, and to cover the entire active layer ACT of the transistor TR.

The lower metal layer 110 may include a material capable of blocking light. In an embodiment, the lower metal layer 110 may be formed of an opaque metal material capable of blocking the transmission of light, but the disclosure is not limited thereto. As another example, the lower metal layer 110 may not be provided.

A buffer layer 161 may be disposed on the lower metal layer 110. The buffer layer 161 may be disposed to cover (or overlap) the entire surface of the substrate SUB where the lower metal layer 110 is disposed. The buffer layer 161 may protect the transistor TR from moisture that may penetrate the substrate SUB, which is vulnerable to moisture.

A semiconductor layer 120 may be disposed on the buffer layer 161. The semiconductor layer 120 may include the active layer ACT of the transistor TR. As described above, the active layer ACT of the transistor TR may be disposed to overlap the first light blocking pattern BML.

The semiconductor layer 120 may include polycrystalline silicon, monocrystalline silicon, or an oxide semiconductor. Here, polycrystalline silicon may be formed by crystallizing amorphous silicon. In an embodiment where the semiconductor layer 120 includes polycrystalline silicon, the active layer ACT of the transistor TR may include doped regions that are doped with impurities and a channel region between the doped regions. In an embodiment, the semiconductor layer 120 may include an oxide semiconductor. The oxide semiconductor may be, for example, indium tin oxide (ITO), indium zinc oxide (IZO), indium gallium oxide (IGO), indium zinc tin oxide (IZTO), indium gallium zinc oxide (IGZO), indium gallium tin oxide (IGTO), or indium gallium zinc tin oxide (IGZTO).

A gate insulating film 162 may be disposed on the semiconductor layer 120. The gate insulating film 162 may serve (or function) as a gate insulating film for the transistor TR. The gate insulating film 162 may be formed as a multi-layer in which inorganic layers including at least one of, for example, silicon oxide ($SiO_x$), silicon nitride ($SiN_x$), and silicon oxynitride ($SiO_xN_y$) are alternately stacked.

A first conductive layer 130 may be disposed on the gate insulating film 162. The first conductive layer 130 may include a gate electrode GE of the transistor TR. The gate electrode GE of the transistor TR may be disposed to overlap the channel region of the active layer ACT of the transistor TR in the third direction DR3, which is the thickness direction of the display device 10.

A first interlayer insulating film 163 may be disposed on the first conductive layer 130. The first interlayer insulating film 163 may be disposed to cover (or overlap) the gate electrode GE of the transistor TR. The first interlayer insulating film 163 may serve as an insulating film between the first conductive layer 130 and layers disposed on the first conductive layer 130 and may protect the first conductive layer 130.

A second conductive layer 140 may be disposed on the first interlayer insulating film 163. The second conductive layer 140 may include a drain electrode SD1 and a source electrode SD2 of the transistor TR.

The drain electrode SD1 and the source electrode SD2 of the transistor TR may be electrically connected to both end portions of the active layer ACT of the transistor TR through contact holes that penetrate the first interlayer insulating film 163 and the gate insulating film 162. The source electrode SD2 may be electrically connected to the first light blocking pattern BML through a contact hole that penetrates the first interlayer insulating film 163, the gate insulating film 162, and the buffer layer 161.

A second interlayer insulating film 164 may be disposed on the second conductive layer 140. The second interlayer insulating film 164 may serve as an insulating film between the second conductive layer 140 and layers disposed on the second conductive layer 140 and may protect the second conductive layer 140.

A third conductive layer 150 may be disposed on the second interlayer insulating film 164. The third conductive layer 150 may include the first voltage line VL1, the second voltage line VL2, and a first conductive pattern CDP.

A high-potential voltage (or a first power supply voltage), which is to be provided to the transistor TR, may be applied to the first voltage line VL1, and a low-potential voltage (or a second power supply voltage), which is lower than the high-potential voltage), may be applied to the second voltage line VL2.

The first voltage line VL1 may be electrically connected to the drain electrode SD1 of the transistor TR through a contact hole that penetrates the second interlayer insulating film 164.

The second voltage line VL2 may be electrically connected to the second electrode 220 through the second electrode contact hole CTS, which penetrates a via layer 165 that will be described below. The second power supply voltage applied to the second voltage line VL2 may be provided to the second electrode 220. An alignment signal for aligning the light-emitting elements ED may be applied to the second voltage line VL2 during the fabrication of the display device 10.

The first conductive pattern CDP may be electrically connected to the transistor TR. The first conductive pattern CDP may be electrically connected to the source electrode SD2 of the transistor TR through a contact hole that penetrates the second interlayer insulating film 164. Also, the first conductive pattern CDP may be electrically connected to the first electrode 210 through the first electrode contact hole CTD, which penetrates the via layer 165. The transistor TR may transmit the first power supply voltage, applied from the first voltage line VL1 to the first electrode 210 through the first conductive pattern CDP.

The via layer 165 may be disposed on the third conductive layer 150. The via layer 165 may be disposed on the second interlayer insulating film 164 where the third conductive layer 150 is disposed. The via layer 165 may include an organic insulating material such as, for example, polyimide (PI). The via layer 165 may perform a surface planarization function.

Each of the buffer layer 161, the gate insulating film 162, the first interlayer insulating film 163, and the second interlayer insulating film 164 may include inorganic layers that are alternately stacked. For example, each of the buffer layer 161, the gate insulating film 162, the first interlayer insulating film 163, and the second interlayer insulating film 164 may be formed as a double-layer or a multi-layer in which inorganic layers including at least one of, for example, $SiO_x$, $SiN_x$, and $SiO_xN_y$ are alternately stacked, but the disclosure is not limited thereto. As another example, each of the buffer layer 161, the gate insulating film 162, the first interlayer insulating film 163, and the second interlayer insulating film 164 may be formed as a single inorganic layer of, for example, $SiO_x$, $SiN_x$, and $SiO_xN_y$.

The first, second, and third conductive layers 130, 140, and 150 may be formed as single layers or multi-layers including at least one of molybdenum (Mo), aluminum (Al), chromium (Cr), gold (Au), titanium (Ti), nickel (Ni), neodymium (Nd), copper (Cu), and an alloy thereof, but the disclosure is not limited thereto.

The display element layer may be disposed on the via layer 165. The cross-sectional structure of the display element layer disposed on the circuit element layer CCL will hereinafter be described with reference to FIGS. 2 to 4.

The second bank 400 may be disposed on the via layer 165, in the emission area EMA. The second bank 400 may include sub-banks 410 and 420, which are disposed in the emission area EMA to be spaced apart from each other. In an embodiment, the second bank 400 may include first and second sub-banks 410 and 420, which are spaced apart from each other in the first direction DR1. The first and second sub-banks 410 and 420 may be disposed on a surface of the via layer 165. The first and second sub-banks 410 and 420 may protrude from the surface of the via layer 165 in the thickness direction of the substrate SUB. The light-emitting elements ED may be disposed between the first and second sub-banks 410 and 420, which are spaced apart from each other.

The second bank 400 may include inclined side surfaces and may change the traveling direction of light that is emitted by the light-emitting elements ED and travels toward the side surfaces of the second bank 400 into an upward direction (e.g., the display direction). For example, the second bank 400 may provide space in which the light-emitting elements ED are to be disposed, and may serve as a reflective barrier that changes, to the display direction, the traveling direction of light emitted by the light-emitting elements ED. In an embodiment, the second bank 400 may include an organic insulating material such as PI, but the disclosure is not limited thereto.

The first and second electrodes 210 and 220 may be disposed on the second bank 400 and parts of the via layer 165 exposed by the second bank 400.

As described above, the first and second electrodes 210 and 220 may extend in the second direction DR2 and may be disposed in and across the emission area EMA and the subarea SA. The first and second electrodes 210 and 220 may be disposed on the second bank 400 and the parts of the via layer 165 exposed by the second bank 400, in the emission area EMA, and may be disposed on the via layer 165, in the non-emission area.

The first electrode 210 may be disposed on the first sub-bank 410 in the emission area EMA. The first electrode 210 may be disposed on a first side surface of the first sub-bank 410 that faces the second sub-bank 420, in the emission area EMA, and may extend outward from the first side surface of the first sub-bank 410 to be disposed even on part of the via layer 165 exposed by the first and second sub-banks 410 and 420, between the first and second sub-banks 410 and 420.

The second electrode 220 may be disposed on the second sub-bank 420 in the emission area EMA. The second electrode 220 may be disposed on a first side surface of the second sub-bank 420 that faces the first sub-bank 410, in the emission area EMA, and may extend outward from the first side surface of the second sub-bank 420 to be disposed even on part of the via layer 165 exposed by the first and second sub-banks 410 and 420, between the first and second sub-banks 410 and 420. The first and second sub-banks 410 and 420 may be spaced apart from, and face, each other in the first direction DR1, between the first and second sub-banks 410 and 420.

The first electrode 210 may be electrically connected to the first conductive pattern CDP through the first electrode contact hole CTD, which penetrates the via layer 165, and the second electrode 220 may be electrically connected to the second voltage line VL2 through the second electrode contact hole CTS, which penetrates the via layer 165.

Specifically, the first electrode 210 may electrically contact the first conductive pattern CDP through the first electrode contact hole CTD, which penetrates the via layer 165, and the second electrode 220 may electrically contact the second voltage line VL2 through the second electrode contact hole CTS, which penetrates the via layer 165. The first electrode 210 may be electrically connected to the transistor TR through the first conductive pattern CDP, and the second electrode 220 may be electrically connected to the second voltage line VL2 so that the second power supply voltage may be transmitted thereto. FIG. 3 illustrates that the first and second electrode contact holes CTD and CTS overlap the first bank 600 in the third direction DR3, but the locations of the first and second electrode contact holes CTD and CTS are not particularly limited.

The first and second electrodes 210 and 220 disposed in each pixel PX may be separated from those of the neighboring pixel PX adjacent to the pixel PX in the second direction DR2, in the separation part ROP of the subarea SA. The first and second electrodes 210 and 220, which are separated in the separation part ROP of the subarea SA, may be obtained by forming electrode lines, which are to be used in aligning the light-emitting elements ED, to extend in the second direction DR2, aligning the light-emitting elements ED, and separating the electrode lines from the separation part ROP of the subarea SA. The electrode lines may be used to generate an electric field in the pixel PX to align the light-emitting elements ED during the manufacturing of the display device 10.

The first and second electrodes 210 and 220 may be electrically connected to the light-emitting elements ED. The first and second electrodes 210 and 220 may be electrically connected to both end portions of each of the light-emitting elements ED through the first and second contact electrodes 710 and 720 and may transmit electrical signals from the first conductive pattern CDP and the second voltage line VL2 to the light-emitting elements ED.

As described above, the first electrode 210 may include the first patterns GR1, which are recessed from the top surface of the first electrode 210 and the first side surface of the first electrode 210 that faces the second electrode 220. The first patterns GR1 may be engraved patterns that are recessed vertically (or in the thickness direction of the first electrode 210) from the top surface of the first electrode 210, in a cross-sectional view. Specifically, the first patterns GR1 may be recessed downwardly from the top surface of the first electrode 210 in a cross-sectional view.

The first electrode 210 may have different thicknesses due to the first patterns GR1. For example, the first electrode 210 may be thinner in regions where the first patterns GR1 are formed than in regions where the first patterns GR1 are not formed.

The second electrode 220 may include the second patterns GR2, which are recessed from the top surface of the second electrode 220 and the first side surface of the second electrode 220 that faces the first electrode 210. The second patterns GR2 may be engraved patterns that are recessed vertically (or in the thickness direction of the second electrode 220) from the top surface of the second electrode 220, in a cross-sectional view. Specifically, the second patterns GR2 may be recessed downwardly from the top surface of the second electrode 220 in a cross-sectional view.

The second electrode 220 may have different thicknesses due to the second patterns GR2. For example, the second electrode 220 may be thinner in regions where the second patterns GR2 are formed than in regions where the second patterns GR2 are not formed.

During the alignment of the light-emitting elements ED, the light-emitting elements ED may be dispersed in ink and may then be sprayed onto the first and second electrodes 210 and 220. In this case, the light-emitting elements ED, dispersed in ink, may be induced to be aligned on the first patterns GR1 and the second patterns GR2, which are relatively thin, due to the flowability of the ink. For example, as each of the first and second electrodes 210 and 220 has different heights due to the presence of the first patterns GR1 or the second patterns GR2, the light-emitting elements ED may be induced to be aligned over regions that have a relatively small height (or a relatively low level).

The first and second electrodes 210 and 220 may include a conductive material with high reflectance. In an embodiment, the first and second electrodes 210 and 220 may include a metal with high reflectance such as silver (Ag), Cu, Al, or an alloy of Al, Ni, or lanthanum (La). The first and second electrodes 210 and 220 may reflect light emitted by the light-emitting elements ED to travel toward the inclined side surfaces of the second bank 400, in a direction from the surfaces of the first and second electrodes 210 and 220 to above the pixel PX.

However, the disclosure is not limited thereto. As another example, the first and second electrodes 210 and 220 may include a transparent conductive material. In an embodiment, the first and second electrodes 210 and 220 may include a material such as ITO, IZO, or ITZO. In some embodiments, the first and second electrodes 210 and 220 may have a structure in which one or more layers of a transparent conductive material and a metal with high reflectance are stacked or may be formed as single layers including a transparent conductive material and/or a metal with high reflectance. In an embodiment, the first and second electrodes 210 and 220 may have a stack structure of ITO/Ag/ITO/, ITO/Ag/IZO, or ITO/Ag/ITZO/IZO.

The first insulating layer 510 may be disposed on the first and second electrodes 210 and 220. The first insulating layer 510 may be disposed on the first and second electrodes 210 and 220 to cover the first and second electrodes 210 and 220. The first insulating layer 510 may protect and insulate the first and second electrodes 210 and 220. Also, the first insulating layer 510 may prevent the light-emitting elements ED from being damaged by directly contacting other elements. The first insulating layer 510 may include an inorganic insulating material, but the disclosure is not limited thereto.

The first insulating layer 510 may be disposed to completely cover the first and second electrodes 210 and 220, in the emission area EMA. As the first insulating layer 510 includes an inorganic insulating material, the first insulating layer 510 may have a surface shape that reflects the height differences in the underlying layer(s) or element(s). In this case, the first insulating layer 510, which is disposed on the first and second electrodes 210 and 220 where the first patterns GR1 and the second patterns GR2 are formed, in the emission area EMA, may include stepped structures GR3, which reflect the height differences in the first and second electrodes 210 and 220. As the first insulating layer 510 reflects the height differences in the first and second electrodes 210 and 220 where the first patterns GR1 and the second patterns GR2 are formed, the first insulating layer 510, similar to the first patterns GR1 and the second patterns GR2, may have a recessed shape in a cross-sectional view even though the first insulating layer 510 is disposed on the first and second electrodes 210 and 220.

The first insulating layer 510 may not be disposed in the separation part ROP of the subarea SA. The first insulating layer 510 may include the first contact hole CNT1, which exposes at least a part of the first electrode 210 through the first insulating layer 510, in the subarea SA, and the second contact hole CNT2, which exposes at least a part of the second electrode 220 through the first insulating layer 510, in the subarea SA.

The first contact hole CNT1 may expose a part of the top surface of the first electrode 210, in the subarea SA, and the second contact hole CNT2 may expose a part of the top surface of the second electrode 220, in the subarea SA. The first and second electrodes 210 and 220 may be electrically connected to the first and second contact electrodes 710 and 720 through the first and second contact holes CNT1 and CNT2, respectively, in the subarea SA.

The first bank 600 may be disposed on the first insulating layer 510. As described above, the first bank 600 may be disposed along the boundaries of the pixel PX to surround the emission area EMA and the subarea SA and to separate the emission area EMA and the subarea SA. The first bank 600 may be formed to have a greater height than the second bank 400 and may thus allow ink having the light-emitting elements ED dispersed therein to be properly mixed into the emission area EMA without being mixed into other neighboring pixels PX, during inkjet printing for aligning the light-emitting elements ED.

The light-emitting elements ED may be disposed in the emission area EMA. The light-emitting elements ED may be disposed between the first and second sub-banks 410 and 420, in the emission area EMA. The light-emitting elements ED may be disposed on the first insulating layer 510 so that both end portions of each of the light-emitting elements ED may be placed on the first patterns GR1 and the second patterns GR2. As described above, the first insulating layer 510 may include the stepped structures GR3, which reflect the height differences in the first and second electrodes 210 and 220, and the light-emitting elements ED may be formed on the stepped structures GR3 on the first insulating layer 510.

Each of the light-emitting elements ED may include semiconductor layers that are doped with dopants of different conductivity types. As each of the light-emitting elements ED includes semiconductor layers, end portions of the light-emitting elements may be aligned to be oriented in a particular direction in accordance with the direction of an electric field formed on the first and second electrodes 210 and 220. Also, as each of the light-emitting elements ED includes a device active layer, the light-emitting elements ED may emit light of a particular wavelength range.

A second insulating layer 520 may be disposed on parts of the light-emitting elements ED. The second insulating layer 520 may be disposed to surround parts of the outer surfaces of the light-emitting elements ED, but not to cover both end portions of each of the light-emitting elements ED. Parts of the second insulating layer 520 on the light-emitting elements ED may extend in the first direction DR1 in a plan view, on the first insulating layer 510. The second insulating layer 520 may protect and fix the light-emitting elements ED during the fabrication of the display device 10. In an embodiment, the second insulating layer 520 may include an organic insulating material, but the disclosure is not limited thereto.

A third insulating layer 530 may be interposed between the light-emitting elements ED and the second insulating layer 520. The third insulating layer 530 may include an inorganic insulating material. As the third insulating layer 530 includes an inorganic insulating material, the third insulating layer 530 may fix the light-emitting elements ED on the first insulating layer 510 and may thus prevent the deviation (or displacement of) of the light-emitting elements ED that may be caused by an organic insulating material before the formation of the second insulating layer 520, even if the second insulating layer 520 includes an organic insulating material. However, the disclosure is not limited thereto. As another example, the third insulating layer 530 may not be provided.

The first and second contact electrodes 710 and 720 may be disposed on the second insulating layer 520.

The first contact electrode 710 may be disposed on the first electrode 210. The first contact electrode 710 may electrically contact the first end portions of the light-emitting elements ED, exposed by the second and third insulating layers 520 and 530, and the first electrode 210. The first contact electrode 710 may electrically contact a part of the first electrode 210 exposed through the first contact hole CNT1, which penetrates the first insulating layer 510, in the subarea SA, and may electrically contact the first end portions of the light-emitting elements ED, exposed by the second and third insulating layers 520 and 530, in the emission area EMA. The first contact electrode 710 may electrically connect the first end portions of the light-emitting elements ED and the first electrode 210.

The second contact electrode 720 may be disposed on the second electrode 220. The second contact electrode 720 may electrically contact the second end portions of the light-emitting elements ED, exposed by the second and third insulating layers 520 and 530, and the second electrode 220. The second contact electrode 720 may electrically contact a part of the second electrode 220 exposed through the second contact hole CNT2, which penetrates the first insulating layer 510, in the subarea SA, and may electrically contact the second end portions of the light-emitting elements ED, exposed by the second and third insulating layers 520 and 530, in the emission area EMA. The second contact electrode 720 may electrically connect the second end portions of the light-emitting elements ED and the second electrode 220.

The first and second contact electrodes 710 and 720 may be spaced apart from each other by the second and third insulating layers 520 and 530. The first and second contact electrodes 710 and 720 may be disposed on side surfaces of each of the second and third insulating layers 520 and 530, but not on the top surface of the second insulating layer 520, but the disclosure is not limited thereto. As another example, the first and second contact electrodes 710 and 720 may be spaced apart from, and face, each other on the top surface of the second insulating layer 520, and another insulating layer may be further provided between the first and second contact electrodes 710 and 720.

The first and second contact electrodes 710 and 720 may include a conductive material. In an embodiment, the first and second contact electrodes 710 and 720 may include ITO, IZO, ITZO, or Al. The first and second contact electrodes 710 and 720 may include a transparent conductive material. As the first and second contact electrodes 710 and 720 include a transparent conductive material, light emitted through both end portions of each of the light-emitting elements ED may travel toward the first and second electrodes 210 and 220 through the first and second contact electrodes 710 and 720.

Although not specifically illustrated, an insulating layer may be further disposed on the first and second contact electrodes 710 and 720. The insulating layer may be disposed on the entire surface of the substrate SUB to protect elements, disposed on the substrate SUB, from an external environment.

The layout of the first electrode 210, the second electrode 220, the first patterns GR1, the second patterns GR2, and the light-emitting elements ED will hereinafter be described.

Figure 5:
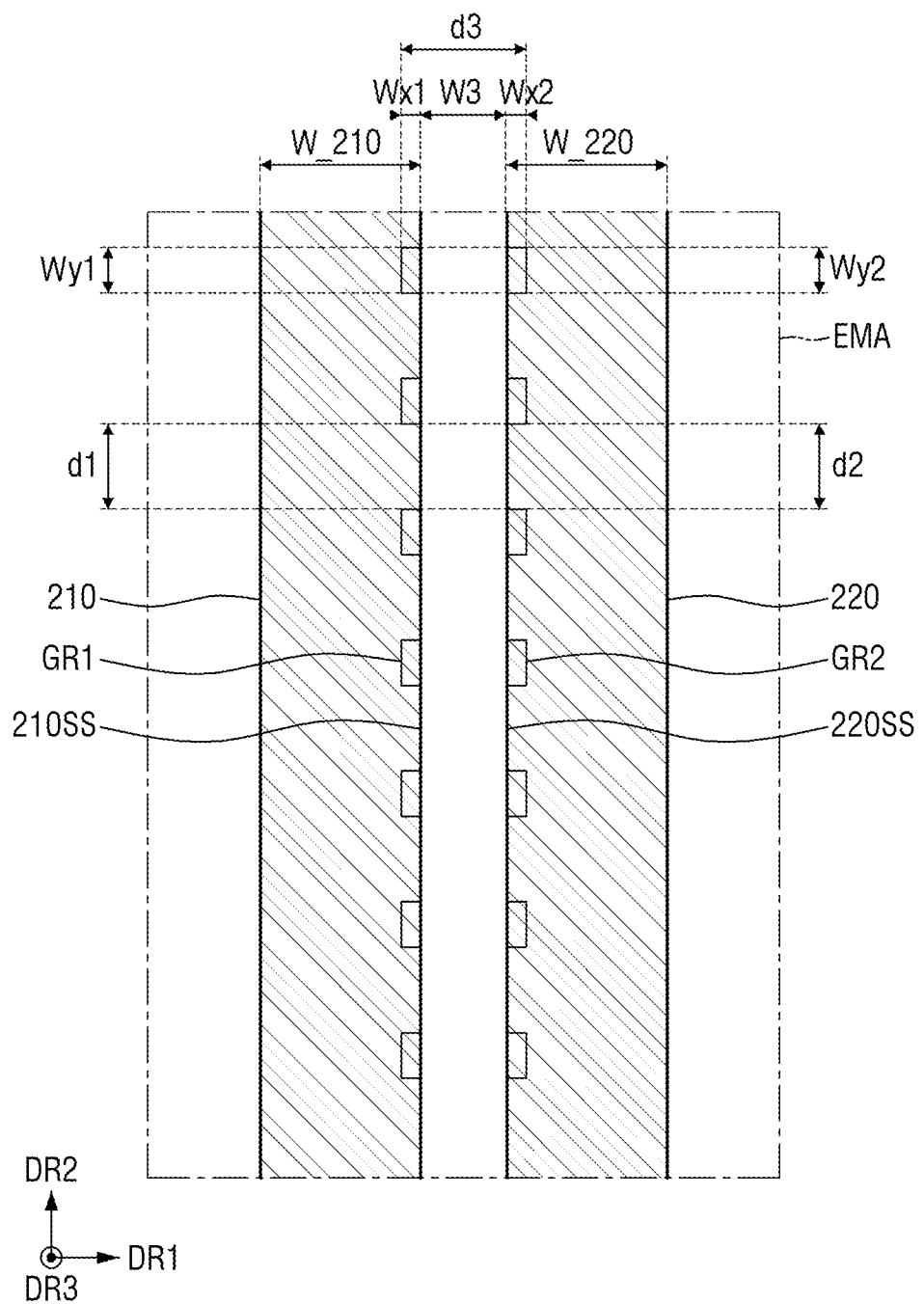
FIG. 5 is a partial plan view schematically illustrating first and second electrodes disposed in an emission area of the display device of FIG. 1.
Figure 6:
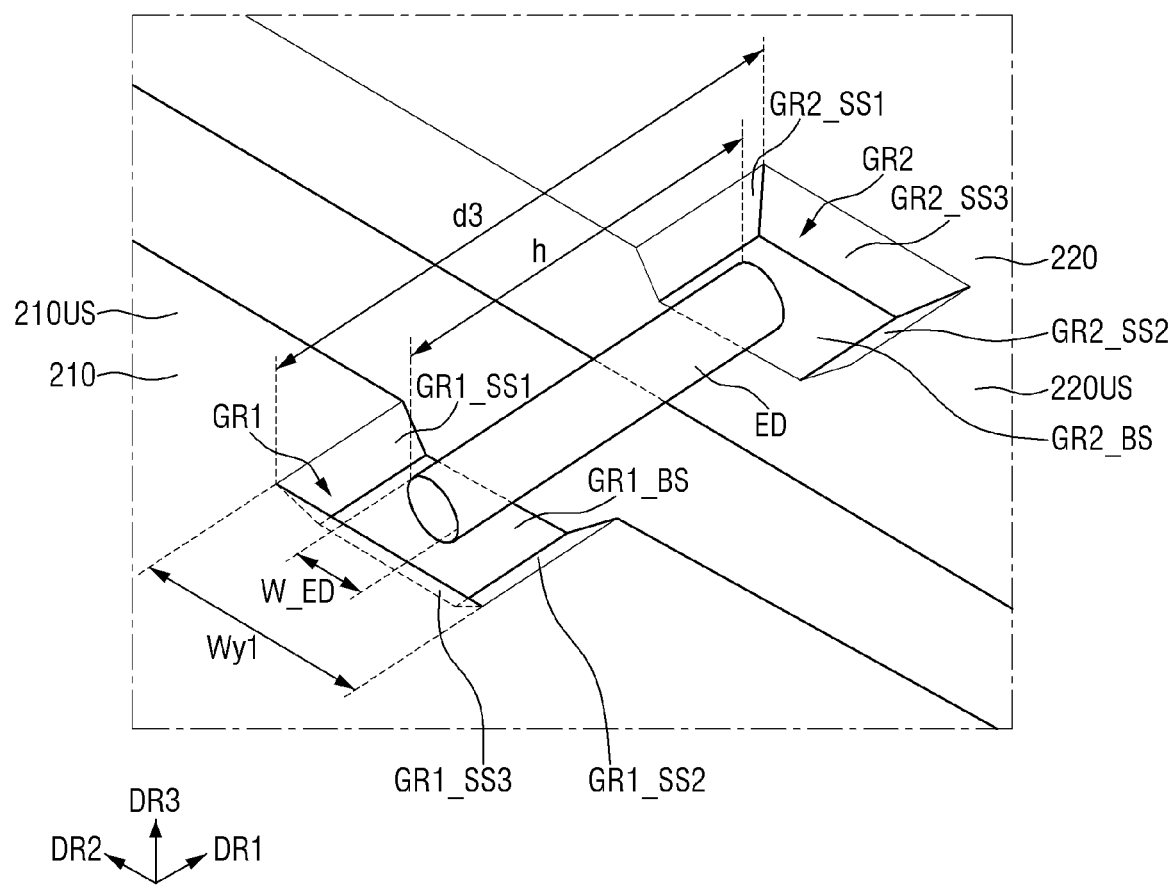
FIG. 6 is a partial perspective view schematically illustrating the layout of first and second electrodes, first and second patterns, and a light-emitting element in an emission area of the display device of FIG. 1.
Figure 7:
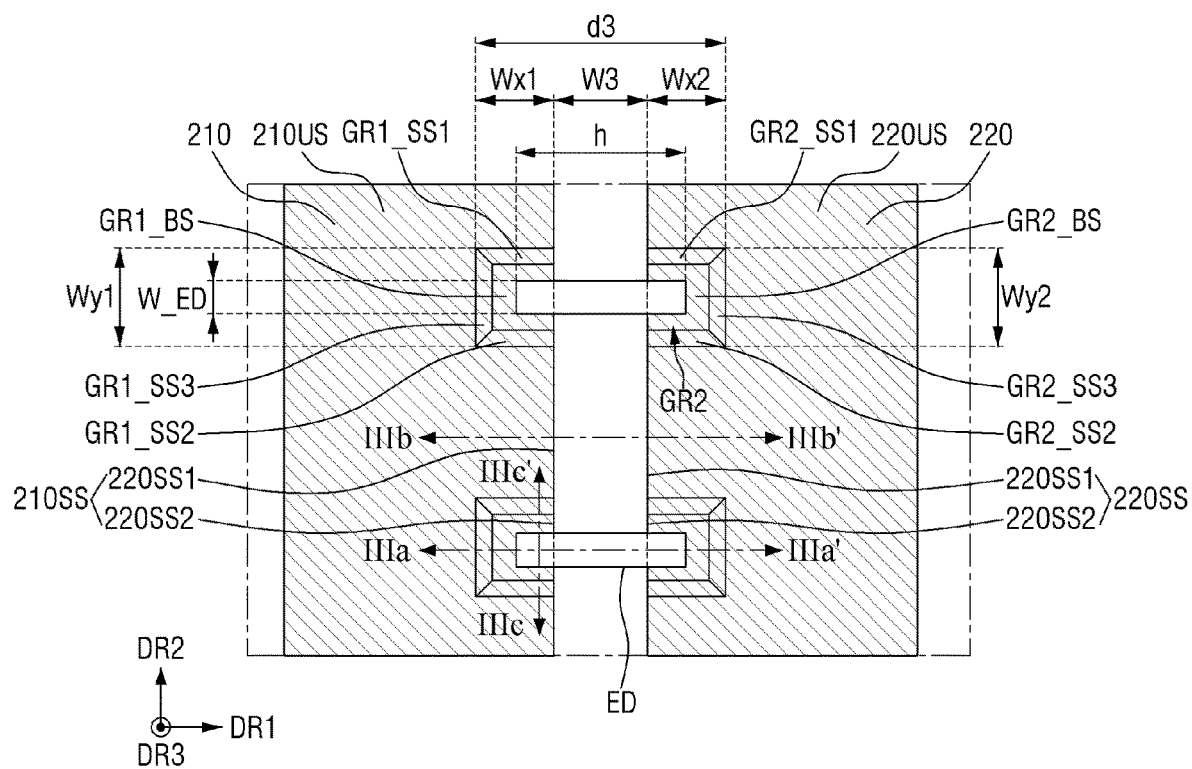
FIG. 7 is a partial plan view schematically illustrating the layout of first and second electrodes, first patterns, second patterns, and light-emitting elements in an emission area of the display device of FIG. 1.

FIG. 5 is a schematic partial plan view illustrating first and second electrodes disposed in an emission area of the display device of FIG. 1. FIG. 6 is a schematic partial perspective view illustrating the layout of first and second electrodes, first and second patterns, and a light-emitting element in an emission area of the display device of FIG. 1. FIG. 7 is a schematic partial plan view illustrating the layout of first and second electrodes, first patterns, second patterns, and light-emitting elements in an emission area of the display device of FIG. 1.

Referring to FIGS. 5 to 7, a first electrode 210 may include first patterns GR1, which are recessed from a top surface 210US of the first electrode 210 and a side surface 210SS of the first electrode 210 that faces a second electrode 220. The first patterns GR1 may be disposed on a side of the first electrode 210 that faces the second electrode 220 in a plan view. The first patterns GR1 may be engraved patterns that are recessed horizontally (e.g., in the opposite direction of the first direction DR1) from the side surface 210SS of the first electrode 210 and vertically (e.g., in the thickness direction of the first electrode 210) from the top surface 210US of the first electrode 210. As the first patterns GR1 are formed to be recessed at the same time from both the top surface 210US and the side surface 210SS of the first electrode 210, the first patterns GR1 may have a stepped structure.

As the first patterns GR1 are formed to be recessed horizontally from the side surface 210SS of the first electrode 210, the height between side surface parts 210SS1 of the first electrode 210 where the first patterns GR1 are not formed may differ from the height of side surface parts 210SS2 of the first electrode 210 where the first patterns GR1 are formed. For example, the height of the side surface parts 210SS1 of the first electrode 210 where the first patterns GR1 are not formed may be greater than the height of the side surface parts 210SS2 of the first electrode 210 where the first patterns GR1 are formed.

The first patterns GR1 may be arranged in a direction. The direction in which the first patterns GR1 are arranged may correspond to the direction in which the first electrode 210 extends. In an embodiment, the first patterns GR1 may be arranged in a row in the second direction DR2. The first patterns GR1 may be disposed to be spaced apart from one another at predetermined distances in the second direction DR2 in a plan view. The first patterns GR1 may have a same size, but the disclosure is not limited thereto. In an embodiment, some of the first patterns GR1 and other first patterns GR1 may have different sizes.

The second electrode 220 may include second patterns GR2, which are recessed from a top surface 220US of the second electrode 220 and a side surface 220SS of the second electrode 220 that faces the first electrode 210. The second patterns GR2 may be disposed on a side of the second electrode 220 that faces the first electrode 210. The second patterns GR2 may be engraved patterns that are recessed horizontally (e.g., in the first direction DR1) from the side surface 220SS of the second electrode 220 and vertically (e.g., in the thickness direction of the second electrode 220) from the top surface 220US of the second electrode 220. As the second patterns GR2 are formed to be recessed at the same time from both the top surface 220US and the side surface 220SS of the second electrode 220, the second patterns GR2 may have a stepped structure.

As the second patterns GR2 are formed to be recessed horizontally from the side surface 220SS of the second electrode 220, the height between side surface parts 220SS1 of the second electrode 220 where the second patterns GR2 are not formed may differ from the height of side surface parts 220SS2 of the second electrode 220 where the second patterns GR2 are formed. In an embodiment, the height of the side surface parts 220SS1 of the second electrode 220 where the second patterns GR2 are not formed may be greater than the height of the side surface parts 220SS2 of the second electrode 220 where the second patterns GR2 are formed.

The second patterns GR2 may be arranged in a direction. The direction in which the second patterns GR2 are arranged may correspond to the direction in which the second electrode 220 extends. In an embodiment, the second patterns GR2 may be arranged in a row in the second direction DR2. The second patterns GR2 may be disposed to be spaced from one another at predetermined distances in the second direction DR2 in a plan view. The second patterns GR2 may have a same size, but the disclosure is not limited thereto. In an embodiment, some of the second patterns GR2 and other second patterns GR2 may have different sizes.

The first patterns GR1 may be disposed to correspond to the second patterns GR2. Each of the first patterns GR1 may be disposed to overlap each of the second patterns GR2 in the first direction DR1. For example, the first patterns GR1 may be disposed to overlap horizontally and thus be in one-one correspondence with the second patterns GR2. The second patterns GR2 may face the first patterns GR1 in the first direction DR1.

A distance d1, in the second direction DR2, between the first patterns GR1 may be uniform. Similarly, a distance d2, in the second direction DR2, between the second patterns GR2 may be uniform. The distance d1, in the second direction DR2, between the first patterns GR1 may be the same as the distance d2, in the second direction DR2, between the second patterns GR2. As the distance d1, in the second direction DR2, between the first patterns GR1 is the same as the distance d2, in the second direction DR2, between the second patterns GR2, the first patterns GR1 may be disposed to correspond one-to-one to the second patterns GR2. Also, because the distance d1, in the second direction DR2, between the first patterns and the distance d2, in the second direction DR2, between the second patterns GR2 are uniform, the distance between light-emitting elements ED, end portions of which are to be arranged on the first patterns GR1 and the second patterns GR2, may be induced to be uniform. Therefore, the density of light-emitting elements ED can be uniformly maintained in an emission area EMA, and as a result, the display quality of the display device 10 can be improved.

However, the disclosure is not limited thereto. As another example, the distance d1, in the second direction DR2, between the first patterns GR1 may be the same as the distance d2, in the second direction DR2, between the second patterns GR2, but the distance d1, in the second direction DR2, between the first patterns GR1 and the distance d2, in the second direction DR2, between the second patterns GR2 may differ from one region to another region in the emission area EMA. By varying the distance d1, in the second direction DR2, between the first patterns GR1 and the distance d2, in the second direction DR2, between the second patterns GR2 from one region to another region in the emission area EMA, the density of light-emitting elements ED can be controlled differently from one region to another region in the emission area EMA.

Referring to FIG. 6, a first pattern GR1 may include first, second, third, and fourth surfaces GR1_SS1, GR1_SS2, GR1_SS3, and GR1_BS. The first surface GR1_SS1 of the first pattern GR1 may be a surface that extends from the top surface 210US and the side surface 210SS of the first electrode 210. The second surface GR1_SS2 of the first pattern GR1 may be a surface that is opposite to the first surface GR1_SS1 of the first pattern GR1. The third surface GR1_SS3 of the first pattern GR1 may be a surface that extends from the side surface 210SS of the first electrode 210 and connects the first and second surfaces GR1_SS1 and GR1_SS2 of the first pattern GR1. The fourth surface GR1_BS of the first pattern GR1 may be a surface that extends from the side surface 210SS of the first electrode 210 and connects the first, second, and third surfaces GR1_SS1, GR1_SS2, and GR1_SS3 of the first pattern GR1. The first pattern GR1 may be defined by the first, second, third, and fourth surfaces GR1_SS1, GR1_SS2, GR1_SS3, and GR1_BS.

The first, second, and third surfaces GR1_SS1, GR1_SS2, and GR1_SS3 of the first pattern GR1 may form sidewalls of the first pattern GR1, and the fourth surface GR1_BS may be the bottom surface of the first pattern GR1. The first, second, and third surfaces GR1_SS1, GR1_SS2, and GR1_SS3 of the first pattern GR1 may also be referred to as first, second, and third sidewalls GR1_SS1, GR1_SS2, and GR1_SS3 of the first pattern GR1. The bottom surface GR1_BS of the first pattern GR1 may be parallel to the top surface 210US of the first electrode 210, and the first, second, and third sidewalls GR1_SS1, GR1_SS2, and GR1_SS3 of the first pattern GR1 may be inclined with respect to the bottom surface GR1_BS of the first pattern GR1. The first, second, and third sidewalls GR1_SS1, GR1_SS2, and GR1_SS3 of the first pattern GR1 may be formed to have a predetermined inclination angle with respect to the bottom surface GR1_BS of the first pattern GR1, and light emitted from a first end portion of a light-emitting element ED may be reflected by the first, second, and third sidewalls GR1_SS1, GR1_SS2, and GR1_SS3 of the first pattern GR1.

The top surface 210US of the first electrode 210 may be disposed between first patterns GR1. The distance d1, in the second direction DR2, between the first patterns GR1 may be substantially the same as the width, in the second direction DR2, of the top surface 210US of the first electrode 210 between the first patterns GR1.

Similarly, referring again to FIG. 6, a second pattern GR2 may include first, second, third, and fourth surfaces GR2_SS1, GR2_SS2, GR2_SS3, and GR2_BS. The first surface GR2_SS1 of the second pattern GR2 may be a surface that extends from the top surface 220US and the side surface 220SS of the second electrode 220. The second surface GR2_SS2 of the second pattern GR2 may be a surface that is opposite to the first surface GR2_SS1 of the second pattern GR2. The third surface GR2_SS3 of the second pattern GR2 may be a surface that extends from the side surface 220SS of the second electrode 220 and connects the first and second surfaces GR2_SS1 and GR2_SS2 of the second pattern GR2. The fourth surface GR2_BS of the second pattern GR2 may be a surface that extends from the side surface 220SS of the second electrode 220 and connects the first, second, and third surfaces GR2_SS1, GR2_SS2, and GR2_SS3 of the second pattern GR2. The second pattern GR2 may be defined by the first, second, third, and fourth surfaces GR2_SS1, GR2_SS2, GR2_SS3, and GR2_BS.

The first, second, and third surfaces GR2_SS1, GR2_SS2, and GR2_SS3 may form sidewalls of the second pattern GR2, and the fourth surface GR2_BS may be the bottom surface of the second pattern GR2. The first, second, and third surfaces GR2_SS1, GR2_SS2, and GR2_SS3 of the second pattern GR2 may also be referred to as first, second, and third sidewalls GR2_SS1, GR2_SS2, and GR2_SS3 of the second pattern GR2. The bottom surface GR2_BS of the second pattern GR2 may be parallel to the top surface 220US of the second electrode 220, and the first, second, and third sidewalls GR2_SS1, GR2_SS2, and GR2_SS3 of the second pattern GR2 may be inclined with respect to the bottom surface GR2_BS of the second pattern GR2. The first, second, and third sidewalls GR2_SS1, GR2_SS2, and GR2_SS3 of the second pattern GR2 may be formed to have a predetermined inclination angle with respect to the bottom surface GR2_BS of the second pattern GR2, and light emitted from a second end portion of the light-emitting element ED may be reflected by the first, second, and third sidewalls GR2_SS1, GR2_SS2, and GR2_SS3 of the second pattern GR2.

The top surface 220US of the second electrode 220 may be disposed between second patterns GR2. The distance d2, in the second direction DR2, between the second patterns GR2 may be substantially the same as the width, in the second direction DR2, of the top surface 220US of the second electrode 220 between the second patterns GR2.

As described above, as the first patterns GR1 and the second patterns GR2 are formed on the first and second electrodes 210 and 220, respectively, as engraved patterns, light-emitting elements ED may be induced to be aligned so that both end portions of each of the light-emitting elements ED may be placed on the first patterns GR1 and the second patterns GR2 during alignment of the light-emitting elements ED. The first patterns GR1, the second patterns GR2, and the light-emitting elements ED may be arranged such that the light-emitting elements ED may be prevented from agglomerating and from being off-center between the first and second electrodes 210 and 220 during alignment of the light-emitting elements ED. In an embodiment, the light-emitting elements ED may be disposed to correspond one-to-one to the first patterns GR1 and the second patterns GR2.

The size of alignment regions into which the light-emitting elements ED are to be induced by the first patterns GR1 and the second patterns GR2 may need to be greater than the size of the light-emitting elements ED to properly place both end portions of each of the light-emitting elements ED on the first patterns GR1 and the second patterns GR2.

Specifically, a width Wy1, in the second direction DR2, of the first patterns GR1 may be greater than a diameter W_ED of the light-emitting elements ED, and a width Wy2, in the second direction DR2, of the second patterns GR2 may be greater than the diameter W_ED of the light-emitting elements ED. The width Wy1, in the second direction DR2, of the first patterns GR1 may be measured as the distance between the first sidewalls GR1_SS1 and the second sidewalls GR1_SS2 of the first patterns GR1, and the width Wy2, in the second direction DR2, of the second patterns GR2 may be measured as the distance between the first sidewalls GR2_SS1 and the second sidewalls GR2_SS2 of the second patterns GR2. As another example, the width Wy1, in the second direction DR2, of the first patterns GR1 may be measured as the width, in the second direction DR2, of the third sidewalls GR1_SS3 of the first patterns GR1, and the width Wy2, in the second direction DR2, of the second patterns GR2 may be measured as the width, in the second direction DR2, of the third sidewalls GR2_SS3 of the second patterns GR2. As the width Wy1, in the second direction DR2, of the first patterns GR1 and the width Wy2, in the second direction DR2, of the second patterns GR2 are greater than the diameter W_ED of the light-emitting elements ED, both end portions of each of the light-emitting elements ED can be stably mounted on the first patterns GR1 and the second patterns GR2.

In case that the width Wy1, in the second direction DR2, of the first patterns GR1 or the width Wy2, in the second direction DR2, of the second patterns GR2 is too much greater than the diameter W_ED of the light-emitting elements ED, multiple light-emitting elements ED may be arranged on the first patterns GR1 and the second patterns GR2. In this case, the light-emitting elements ED may agglomerate to cause contact failure with other elements. Therefore, the width Wy1, in the second direction DR2, of the first patterns GR1 and the width Wy2, in the second direction DR2, of the second patterns GR2 may be four times or less the diameter W_ED of the light-emitting elements ED in order to arrange the light-emitting elements ED so that the light-emitting elements ED correspond one-to-one to the first patterns GR1 and the second patterns GR2. For example, the width Wy1, in the second direction DR2, of the first patterns GR1 and the width Wy2, in the second direction DR2, of the second patterns GR2 may be formed to be greater than the diameter W_ED of the light-emitting elements ED, but less than or equal to four times the diameter W_ED of the light-emitting elements ED.

The width Wy1, in the second direction DR2, of the first patterns GR1 may be the same as the width Wy2, in the second direction DR2, of the second patterns GR2, as illustrated in the drawings. As the first patterns GR1 and the second patterns GR2 are formed by etching parts of the first electrode 210 and parts of the second electrode 220 by using a same mask process during the formation of the first and second electrodes 210 and 220, first patterns GR1 and second patterns GR2 having a same width in the second direction DR2 may be formed. The drawings illustrate that the width Wy1, in the second direction DR2, of the first patterns GR1 and the width Wy2, in the second direction DR2, of the second patterns GR2 are equal to each other, but the disclosure is not limited thereto. In some embodiments, the width Wy1, in the second direction DR2, of the first patterns GR1 may differ from the width Wy2, in the second direction DR2, of the second patterns GR2 corresponding to the first patterns GR1. Even in this case, the width Wy1, in the second direction DR2, of the first patterns GR1 and the width Wy2, in the second direction DR2, of the second patterns GR2 may be greater than the diameter W_ED of the light-emitting elements ED so that both end portions of each of the light-emitting elements ED may be induced to be stably mounted on the first patterns GR1 and the second patterns GR2.

In order for both end portions of each of the light-emitting elements ED to be placed on the first patterns GR1 and the second patterns GR2, a width d3, in the first direction DR1, of imaginary alignment regions into which the light-emitting elements ED are to be induced by the first patterns GR1 and the second patterns GR2 may be greater than a length h of the light-emitting elements ED.

Specifically, a distance W3, in the first direction DR1, between the first and second electrodes 210 and 220 may be smaller than the length h of the light-emitting elements ED. By arranging the first and second electrodes 210 and 220 such that the distance W3 between the first and second electrodes 210 and 220 may be smaller than the length h of the light-emitting elements ED, both end portions of each of the light-emitting elements ED may be arranged on the first and second electrodes 210 and 220. The distance W3 between the first and second electrodes 210 and 220 may be measured as the distance between the side surface 210SS of the first electrode 210 and the side surface 220SS of the second electrode 220.

The width d3, in the first direction DR1, of the imaginary alignment regions defined by the first patterns GR1 and the second patterns GR2 may be greater than the length h of the light-emitting elements ED. Specifically, the width d3, in the first direction DR1, of the imaginary alignment regions defined by the first patterns GR1 and the second patterns GR2 may be measured as a distance d3 between the third sidewalls GR1_SS3 of the first patterns GR1 and the third sidewalls GR2_SS3 of the second patterns GR2. As described above, the third sidewalls GR1_SS3 of the first patterns GR1 may be spaced apart from, and face, the third sidewalls GR2_SS3 of the second patterns GR2, and the width d3, in the first direction DR1, of the imaginary alignment regions defined by the first patterns GR1 and the second patterns GR2 may be measured as the distance between the third sidewalls GR1_SS3 of the first patterns GR1 and the third sidewalls GR2_SS3 of the second patterns GR2 that are spaced from and face each other in the first direction DR1.

The width d3, in the first direction DR1, of the imaginary alignment regions defined by the first patterns GR1 and the second patterns GR2 may be the same as the sum of a width Wx1, in the first direction DR1, of the first patterns GR1, a width Wx2, in the first direction DR1, of the second patterns GR2, and the distance W3 between the first and second electrodes 210 and 220. The width Wx1, in the first direction DR1, of the first patterns GR1 may be measured as the width, in the first direction DR1, of the first sidewalls GR1_SS1 of the first patterns GR1, and the width Wx2, in the first direction DR1, of the second patterns GR2 may be measured as the width, in the first direction DR1, of the first sidewalls GR2_SS1 of the second patterns GR2.

By forming the width d3, in the first direction DR1, of the imaginary alignment regions defined by the first patterns GR1 and the second patterns GR2 to be greater than the length h of the light-emitting elements ED, both end portions of each of the light-emitting elements ED can be stably mounted on the first patterns GR1 and the second patterns GR2.

If the width d3, in the first direction DR1, of the imaginary alignment regions defined by the first patterns GR1 and the second patterns GR2 is too much greater than the length h of the light-emitting elements ED, the light-emitting elements ED may be arranged off-center between the first and second electrodes 210 and 220. In this case, at least one end portion of each of the light-emitting elements ED may fail to be placed on the first or second electrode 210 or 220 and may thus not be able to electrically contact the first or second contact electrode 710 or 720 and to receive electrical signals. Therefore, the width d3, in the first direction DR1, of the imaginary alignment regions defined by the first patterns GR1 and the second patterns GR2 may be less than or equal to two times the length h of the light-emitting elements ED in order for both end portions of each of the light-emitting elements ED to be arranged on the first and second electrodes 210 and 220. For example, the width d3, in the first direction DR1, of the imaginary alignment regions defined by the first patterns GR1 and the second patterns GR2 may be formed to be greater than the length h of the light-emitting elements ED, but less than or equal to two times the length h of the light-emitting elements ED.

Accordingly, the width Wx1, in the first direction DR1, of the first patterns GR1 may be smaller than a width W_210, in the first direction DR1, of the first electrode 210, and the width Wx2, in the first direction DR1, of the second patterns GR2 may be smaller than a width W_220, in the first direction DR1, of the second electrode 220.

The width Wx1, in the first direction DR1, of the first patterns GR1 may be the same as the width Wx2, in the first direction DR1, of the second patterns GR2, but the disclosure is not limited thereto.

Figure 8:
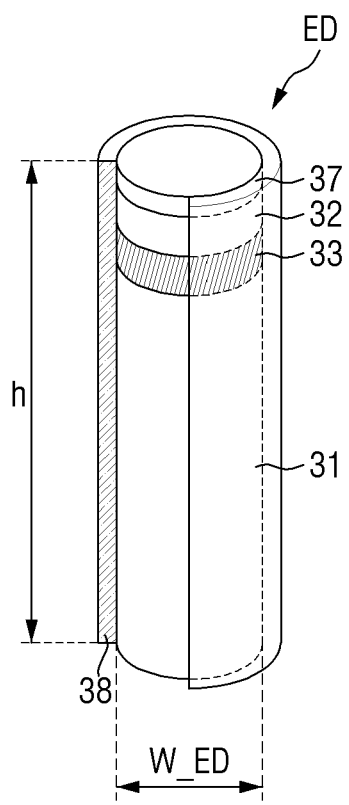
FIG. 8 is a schematic perspective view of a light-emitting element according to an embodiment of the disclosure.

FIG. 8 is a schematic perspective view of a light-emitting element according to an embodiment.

Referring to FIG. 8, a light-emitting element ED, which is a particulate element, may have a rod or cylindrical shape with a predetermined aspect ratio. The length h of the light-emitting element ED may be greater than the diameter W_ED of the light-emitting element ED and may have an aspect ratio of about 6:5 to about 100:1, but the disclosure is not limited thereto.

The light-emitting element ED may have a nanometer-scale size of about 1 nm to about 1 µm or a micrometer-scale size of about 1 µm to about 1 mm. In an embodiment, the diameter W_ED and the length h of the light-emitting element ED may both be at a nanometer scale or micrometer scale. In some embodiments, the diameter W_ED of the light-emitting element ED may be at a nanometer scale, but the length h of the light-emitting element ED may be at a micrometer scale. In some embodiments, some of the light-emitting elements ED may have a diameter W_ED and a length h having a nanometer-scale size, and some of the light-emitting elements ED may have a diameter W_ED and a length h having a micrometer-scale size.

In an embodiment, the light-emitting element ED may be an inorganic light-emitting diode. The inorganic light-emitting diode may include semiconductor layers. In an embodiment, the inorganic light-emitting diode may include a semiconductor layer of a first conductivity type (e.g., an n type), a semiconductor layer of a second conductivity type (e.g., a p type), and an active semiconductor layer interposed between the semiconductor layer of the first conductivity type and the semiconductor layer of the second conductivity type. The active semiconductor layer may receive holes and electrons from the semiconductor layer of the first conductivity type and the semiconductor layer of the second conductivity type, respectively, and the holes and the electrons may combine together in the active semiconductor layer. As a result, the light-emitting element ED may emit light.

In an embodiment, the semiconductor layers of the light-emitting element ED may be sequentially stacked in the length direction of the light-emitting element ED. As illustrated in FIG. 8, the light-emitting element ED may include a first semiconductor layer 31, a device active layer 33, and a second semiconductor layer 32, which are sequentially stacked in the length direction of the light-emitting element ED. The first semiconductor layer 31, the device active layer 33, and the second semiconductor layer 32 may be the semiconductor layer of the first conductivity type, the active semiconductor layer, and the semiconductor layer of the second conductivity type, respectively.

The first semiconductor layer 31 may be doped with a dopant of the first conductivity type. The dopant of the first conductivity type may be Si, Ge, or Sn. In an embodiment, the first semiconductor layer 31 may be n-GaN doped with an n-type dopant such as Si.

The second semiconductor layer 32 may be spaced apart from the first semiconductor layer 31 by the device active layer 33. The second semiconductor layer 32 may be doped with a dopant of the second conductivity type, such as Mg, Zn, Ca, Se, or Ba. In an embodiment, the second semiconductor layer 32 may be p-GaN doped with a p-type dopant such as Mg.

The device active layer 33 may include a material having a single- or multi-quantum well structure. As described above, as electrical signals are applied through the first and second semiconductor layers 31 and 32, the device active layer 33 may emit light because of the combination of electron-hole pairs.

In some embodiments, the device active layer 33 may have a structure in which a semiconductor material having large bandgap energy and a semiconductor material having small bandgap energy are alternately stacked, and may include different Group III-V semiconductor materials depending on the wavelength of light to be emitted.

Light emitted by the device active layer 33 may be output not only through the outer surface, in the length direction, of the light-emitting element ED, but also through both end portions of the light-emitting element ED. For example, the direction in which light emitted by the device active layer 33 is output is not particularly limited.

The light-emitting element ED may further include a device electrode layer 37, which is disposed on the second semiconductor layer 32. The device electrode layer 37 may electrically contact the second semiconductor layer 32. The device electrode layer 37 may be an ohmic contact electrode, but the disclosure is not limited thereto. As another example, the device electrode layer 37 may be a Schottky contact electrode.

In case that both end portions of the light-emitting element ED and first and second contact electrodes 710 and 720 are electrically connected to each other to apply electrical signals to the first and second semiconductor layers 31 and 32, the device electrode layer 37 may be disposed between the second semiconductor layer 32 and the electrodes and may reduce resistance. The device electrode layer 37 may include at least one of Al, Ti, indium (In), Au, Ag, ITO, IZO, and indium tin zinc oxide (ITZO). The device electrode layer 37 may include a semiconductor material doped with an n- or p-type dopant.

The light-emitting element ED may further include a device insulating film 38, which surrounds the outer circumferential surfaces of the first semiconductor layer 31, the second semiconductor layer 32, the device active layer 33, and/or the device electrode layer 37. The device insulating film 38 may be disposed to surround the outer surface of at least the device active layer 33 and may extend in the direction in which the light-emitting element ED extends. The device insulating film 38 may protect the other elements of the light-emitting element ED. The device insulating film 38 may be formed of a material having insulating properties and may thus prevent any short circuit that may occur in case that the device active layer 33 directly contacts electrodes that transmit electrical signals to the light-emitting element ED. As the device insulating film 38 protects the outer circumferential surfaces of the device active layer 33 and the first and second semiconductor layers 31 and 32, the degradation of the emission efficiency of the light-emitting element ED can be prevented.

Figure 9:
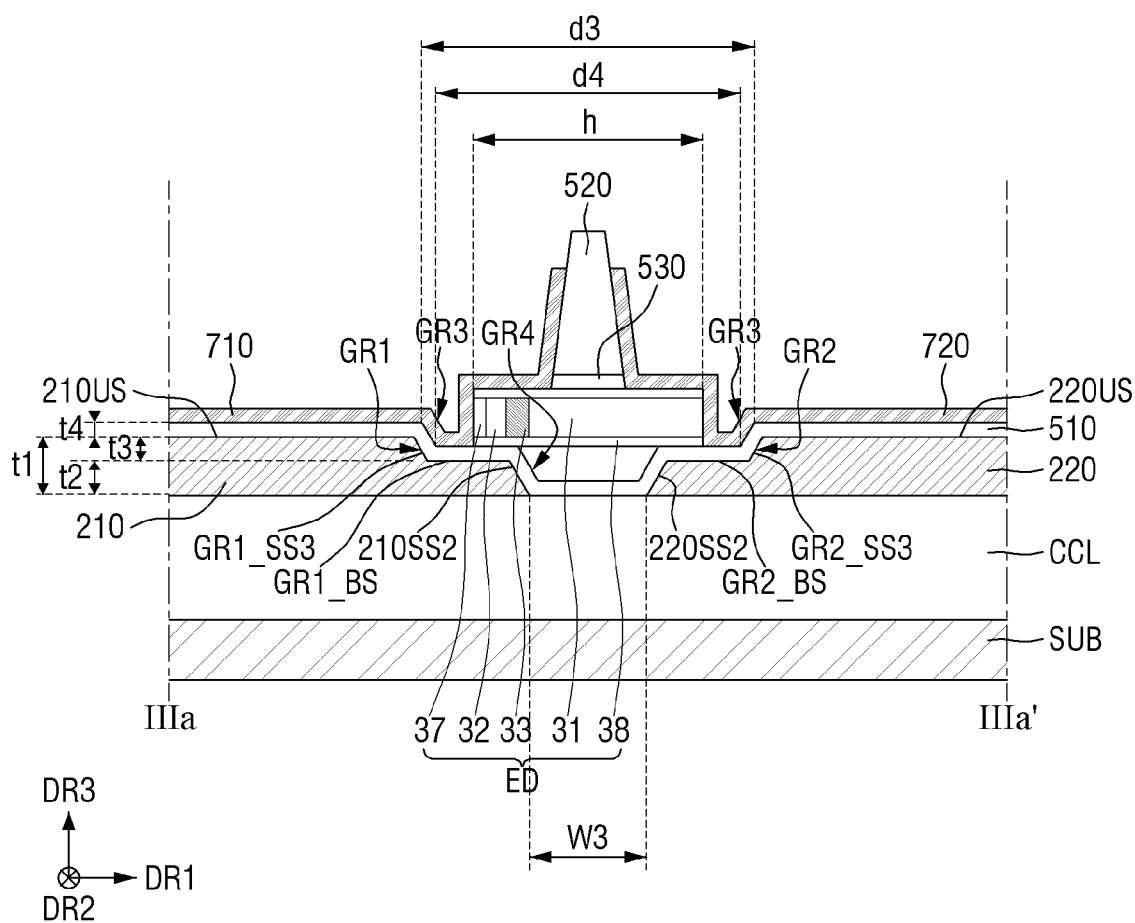
FIG. 9 is a schematic cross-sectional view taken along line of FIG. 7.
Figure 10:
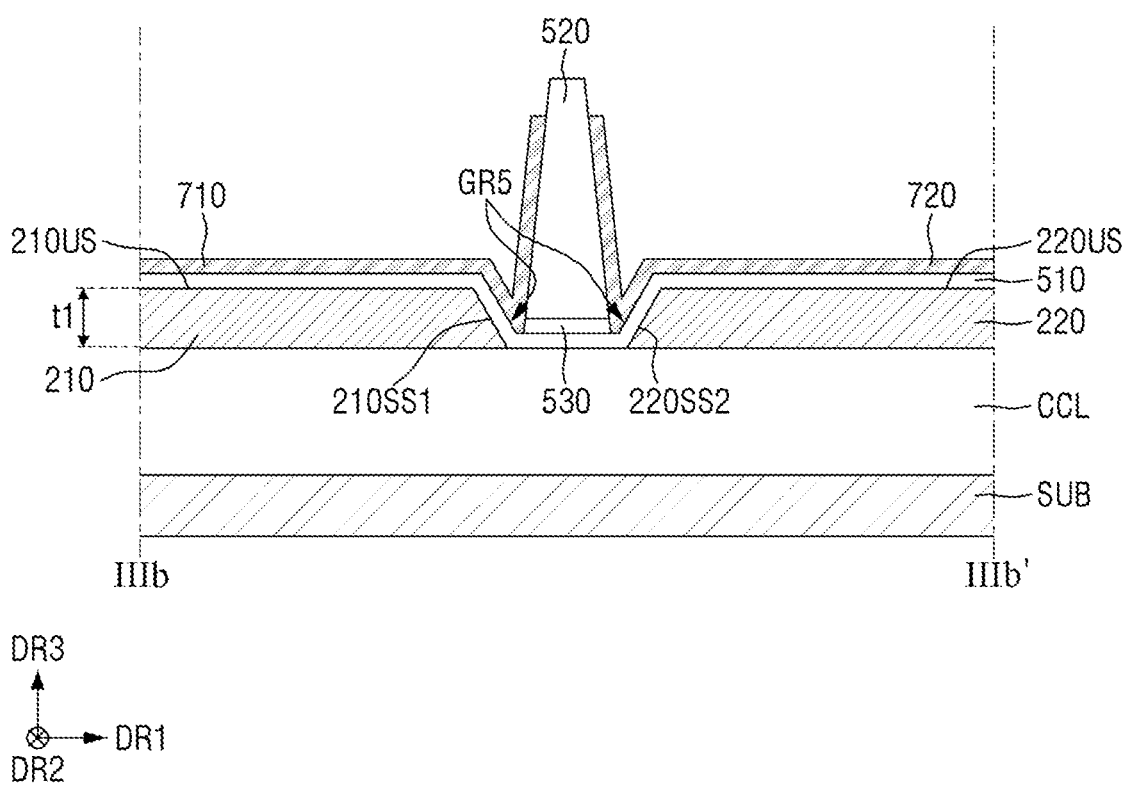
FIG. 10 is a schematic cross-sectional view taken along line IIIb-IIIb' of FIG. 7.
Figure 11:
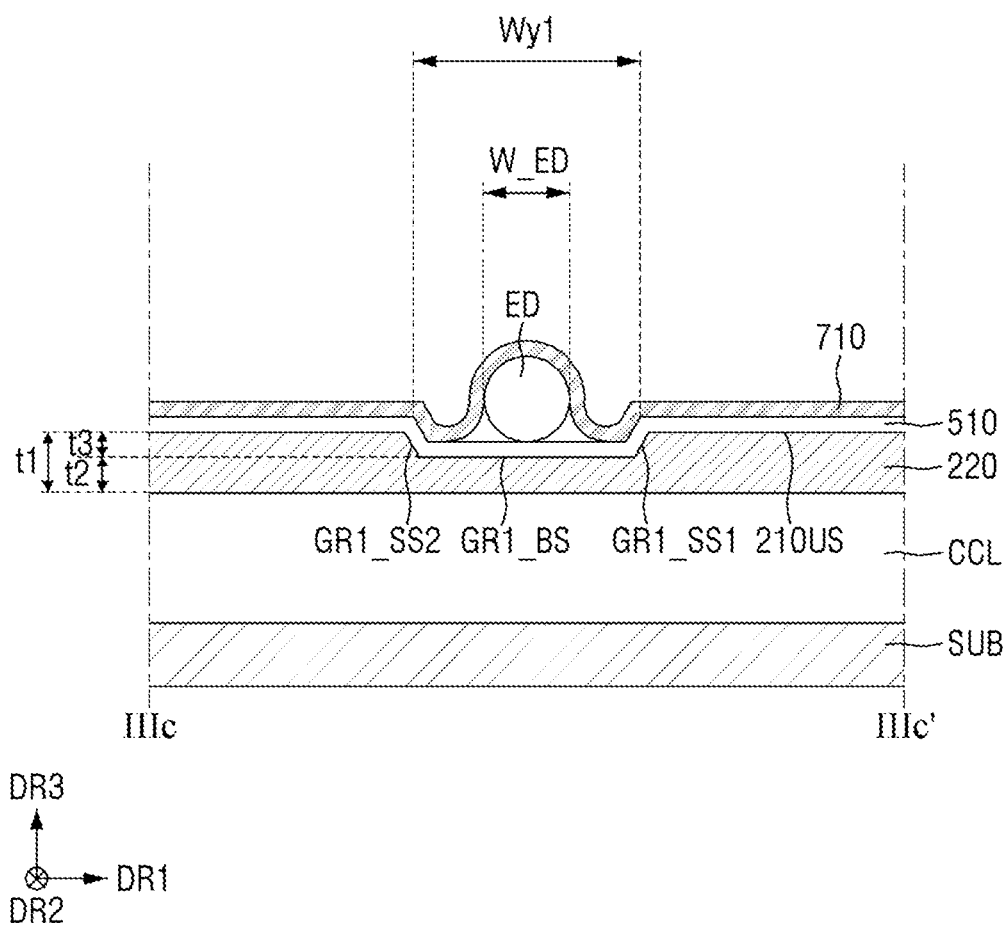
FIG. 11 is a schematic cross-sectional view taken along line IIIc-IIIc' of FIG. 7.

FIG. 9 is a schematic cross-sectional view taken along line IIIa-IIIa' of FIG. 7. FIG. 10 is a schematic cross-sectional view taken along line of FIG. 7. FIG. 11 is a schematic cross-sectional view taken along line IIIc-IIIc' of FIG. 7.

Referring to FIGS. 9 to 11, the first electrode 210 may have a height difference in a region where a first pattern GR1 is formed. The first electrode 210 may have a first thickness t1 in a region where the first pattern GR1 is not formed, and may have a second thickness t2, which is smaller than the first thickness t1, in a region where the first pattern GR1 is formed. The first thickness t1 of the first electrode 210 may be the same as the sum of the second thickness t2 of the first electrode 210 and a thickness t3 of the first pattern GR1.

The thickness t3 of the first pattern GR1, which is recessed from the top surface 210US of the first electrode 210, may be smaller than the thickness of the first electrode 210 in the region where the first pattern GR1 is not formed, i.e., the first thickness t1 of the first electrode 210. For example, the first pattern GR1 may be formed to be recessed from the top surface 210US of the first electrode 210, but not to penetrate the first electrode 210. The thickness t3 of the first pattern GR1 may be measured as the distance from the top surface 210US of the first electrode 210 to the bottom surface GR1_BS of the first pattern GR1.

The second electrode 220 has a similar cross-sectional shape to the first electrode 210, and thus, a detailed description of the cross-sectional shape of the second electrode 220 will be omitted.

The first insulating layer 510 may be disposed on the first and second electrodes 210 and 220. The first insulating layer 510 may have a surface shape that reflects the height differences in the underlying layer(s) or element(s).

Specifically, part of the first insulating layer 510 disposed on the first electrode 210, which has a height difference formed by the first pattern GR1, may include a first stepped structure GR3, which is formed by the first pattern GR1, and a second stepped structure GR4, which is formed by side surface parts 210SS2 and 220SS2 of the first and second electrodes 210 and 220. The first stepped structure GR3 may be formed by the third sidewall GR1_SS3 and the bottom surface GR1_BS of the first pattern GR1, and the second stepped structure GR4 may be formed by the side surface part 210SS2 of the first electrode 210 where the first pattern GR1 is formed, the side surface part 220SS2 of the second electrode 220, and the surface of the via layer 164. The light-emitting element ED may be induced to be aligned with the first stepped structure GR3. A width d4, in the first direction DR1, of the first stepped structure GR3 may be greater than the length h of the light-emitting element ED and be smaller than the distance d3 between the third sidewall GR1_SS3 of the first pattern GR1 and the third sidewall GR2_SS3 of the second pattern GR2.

Parts of the first insulating layer 510 disposed on parts of the first and second electrodes 210 and 220 where the first pattern GR1 and the second pattern GR2 are not formed may include third stepped structures GR5, which are formed by the side surface parts 210SS1 and 220SS2 of the first and second electrodes 210 and 220 and the via layer 165.

The light-emitting element ED may be disposed to be parallel to the top surface of the substrate SUB. Semiconductor layers included in the light-emitting element ED may be sequentially arranged in a direction parallel to the top surface of the substrate SUB. In an embodiment, a first semiconductor layer 31, a device active layer 33, and a second semiconductor layer 32 may be sequentially arranged in the light-emitting element ED to be parallel to the top surface of the substrate SUB.

Specifically, in a cross-sectional view taken from one end portion to the end portion of the light-emitting element ED, the first semiconductor layer 31, the device active layer 33, the second semiconductor layer 32, and the device electrode layer 37 may be sequentially formed in the direction parallel to the top surface of the substrate SUB.

The light-emitting element ED may be disposed on the first insulating layer 510 so that a first end portion of the light-emitting element ED may be disposed on the bottom surface GR1_BS of the first pattern GR1 and a second end portion of the light-emitting element ED may be disposed on the bottom surface GR2_BS of the second pattern GR2. Both end portions of the light-emitting element ED may be induced by first stepped structures GR3 of the first insulating layer 510, which are formed by the first and second patterns GR1 and GR2, to be placed on the first and second patterns GR1 and GR2.

The diameter W_ED of the light-emitting element ED may be greater than the thickness t3 of the first pattern GR1. A thickness t4 of the first insulating layer 510 may be smaller than the thickness t3 of the first pattern GR1. As the diameter W_ED of the light-emitting element ED is greater than the thickness t3 of the first pattern GR1 and the thickness t4 of the first insulating layer 510 is smaller than the thickness t3 of the first pattern GR1, at least a part of the light-emitting element ED may be spaced apart from, and face, the third sidewall GR1_SS3 of the first pattern GR1. Therefore, light emitted from the first end portion of the light-emitting element ED may be incident upon, and reflected by, the third sidewall GR1_SS3 of the first pattern GR1.

The second and third insulating layers 520 and 530 may be disposed on the light-emitting element ED. The second and third insulating layers 520 and 530 may be disposed to surround the outer surface of the light-emitting element ED. The second and third insulating layers 520 and 530 may be disposed to surround the outer surface of the light-emitting element ED, in a region where the light-emitting element ED is disposed, and may be disposed on the first insulating layer 510, in a region where the light-emitting element ED is not disposed. In the region where the light-emitting element ED is disposed, the gap between the second stepped structure GR4 of the first insulating layer 510 and the light-emitting element ED may be filled with a material included in the second insulating layer 520. In the region where the light-emitting element ED is not disposed, the second and third insulating layers 520 and 530 may be disposed in the third stepped structures GR5.

The first and second contact electrodes 710 and 720 may be disposed on the second and third insulating layers 520 and 530. The first and second contact electrodes 710 and 720 may be disposed on both end portions of the light-emitting element ED to surround not only both end portions of the light-emitting element ED but also the outer surfaces of both end portions of the light-emitting element ED. The first contact electrode 710 may be disposed on the side surfaces and the bottom surface of the first pattern GR1, and the second contact electrode 720 may be disposed on the side surfaces and the bottom surface of the second pattern GR2.

Figure 12:
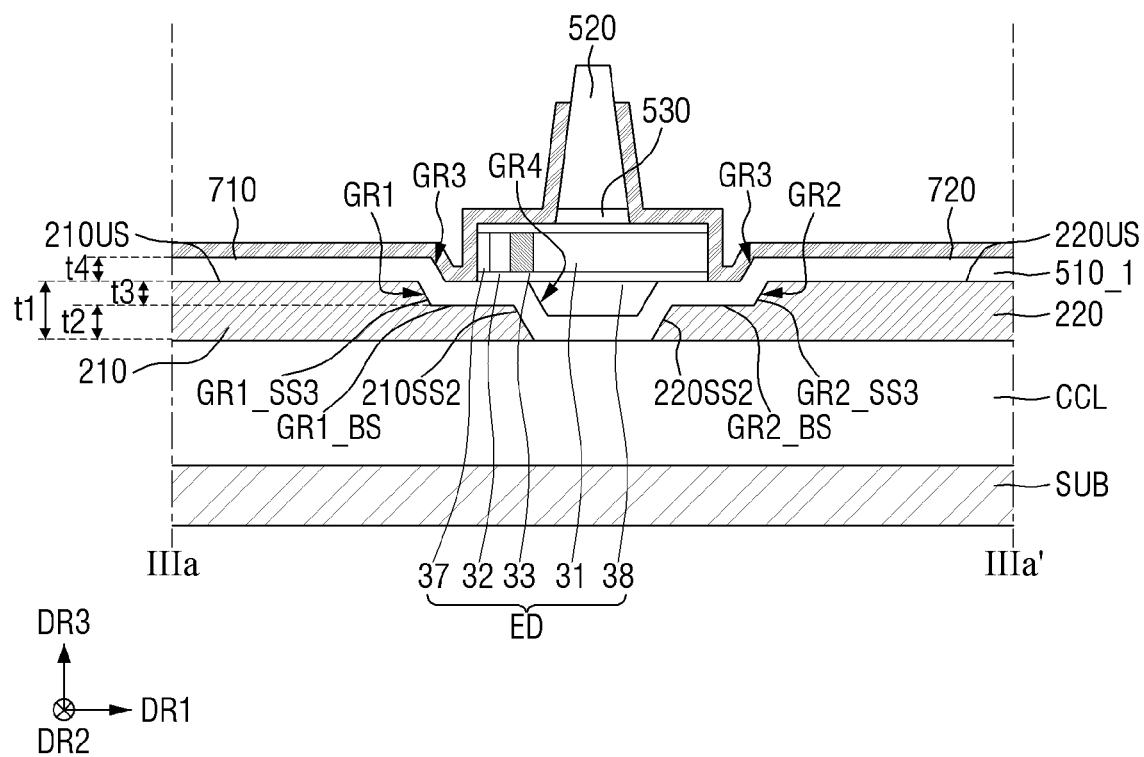
FIG. 12 is a schematic cross-sectional view, taken along line IIIa-IIIa' of FIG. 7, of a display device according to another embodiment of the disclosure.

FIG. 12 is a schematic cross-sectional view, taken along line IIIa-IIIa' of FIG. 7, of a display device according to an embodiment.

The embodiment of FIG. 12 differs from the embodiment of FIG. 9 at least in that a thickness t4 of a first insulating layer 510_1 is the same as a thickness t3 of a first pattern GR1. As the thickness t4 of a first insulating layer 510_1 is the same as the thickness t3 of a first pattern GR1, both end portions of a light-emitting element ED may not face a third sidewall GR1_SS3 of the first pattern GR1 and a third sidewall GR2_SS3 of the second pattern GR2. Even in this case, the first insulating layer 510_1 may include stepped structures GR3, which reflect the height differences in the first and second electrodes 210 and 220 that are formed by the first pattern GR1 and the second pattern GR2. Therefore, both end portions of the light-emitting element ED can be arranged on the first and second patterns GR1 and GR2 by the stepped structure GR3 of the first insulating layer 510.

Figure 13:
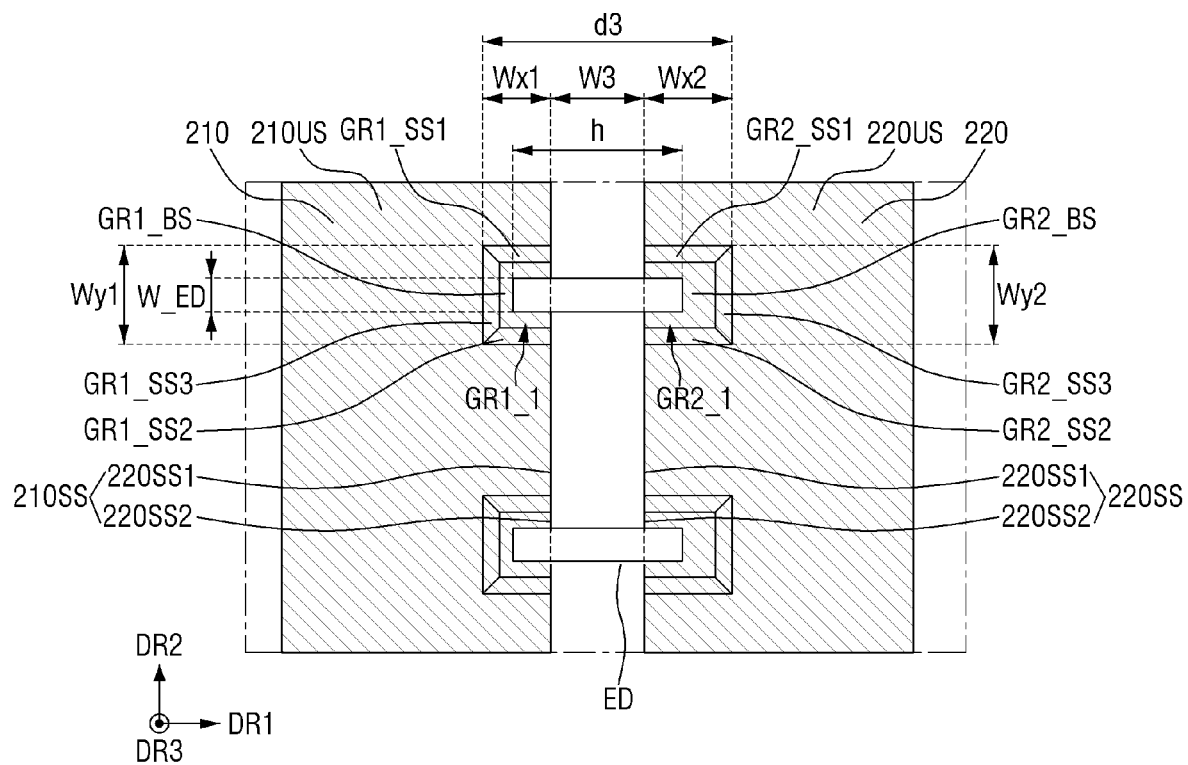
FIG. 13 is a partial plan view schematically illustrating the layout of first and second electrodes, first patterns, second patterns, and light-emitting elements in an emission area of a display device according to another embodiment of the disclosure.

FIG. 13 is a schematic partial plan view illustrating a relative arrangement of first and second electrodes, first patterns, second patterns, and light-emitting elements disposed in an emission area of a display device according to an embodiment.

The embodiment of FIG. 13 differs from the embodiment of FIG. 7 at least in that a width Wx1, in a first direction DR1, of first patterns GR1_1 differs from a width Wx2, in the first direction DR1, of second patterns GR2_1, which correspond to the first patterns GR1_1. Even in this case, a width Wy1, in a second direction DR1, of the first patterns GR1_1 may be the same as a width Wy2, in the second direction DR2, of the second patterns GR2_1, and a distance d3 between third sidewalls GR1_SS3 of the first patterns GR1_1 and third sidewalls GR2_SS3 of the second patterns GR2_1 may be greater than a length h of light-emitting elements ED. Therefore, even though the width Wx1, in a first direction DR1, of the first patterns GR1_1 differs from the width Wx2, in the first direction DR1, of the second patterns GR2_1, both end portions of each of the light-emitting elements ED can be induced to be stably mounted on the first patterns GR1_1 and the second patterns GR2_1 because the distance d3 between the third sidewalls GR1_SS3 of the first patterns GR1_1 and the third sidewalls GR2_SS3 of the second patterns GR2_1 is formed to be greater than the length h of the light-emitting elements ED.

Figure 14:
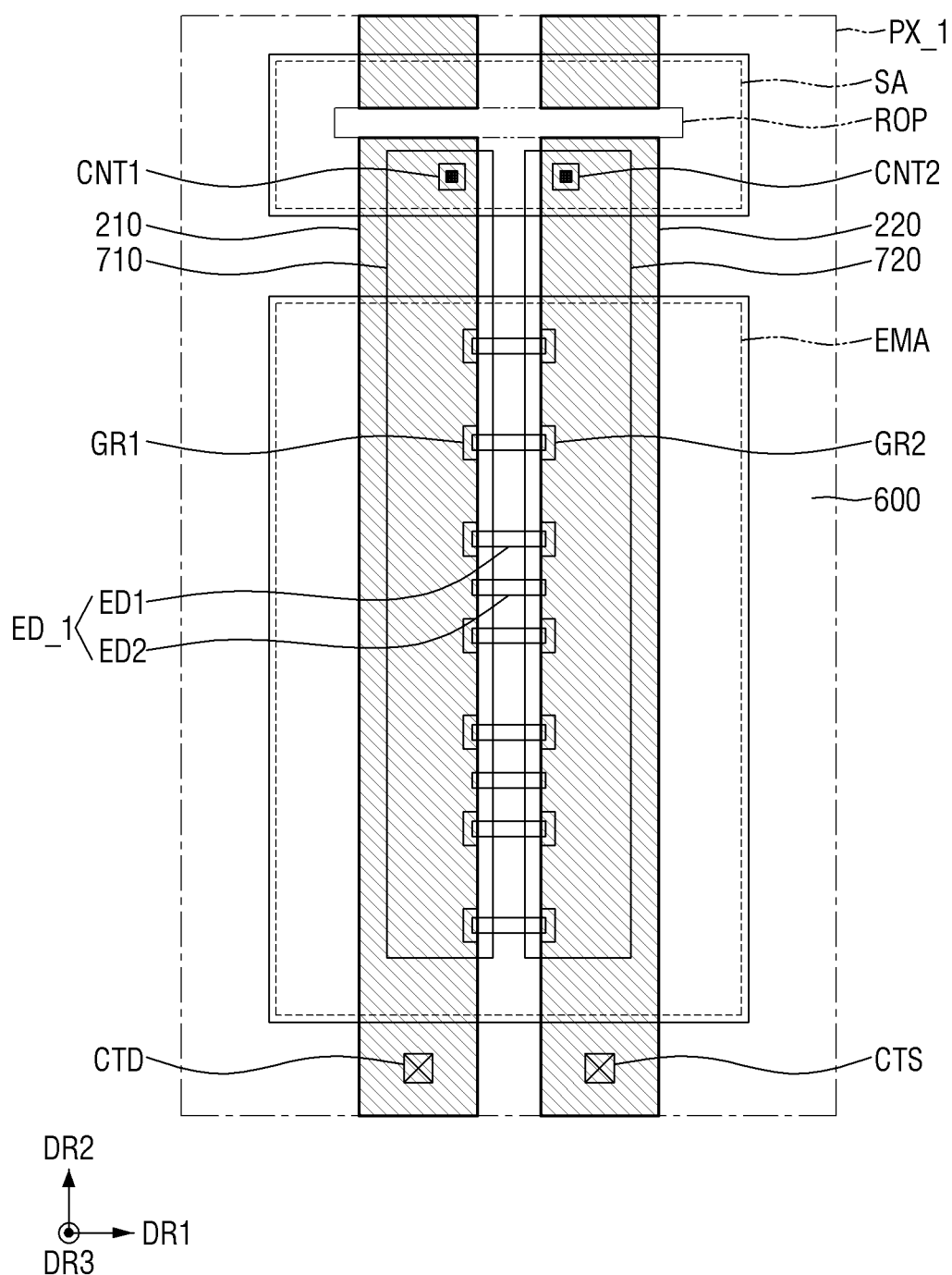
FIG. 14 is a schematic plan view of a pixel of a display device according to another embodiment of the disclosure.
Figure 15:
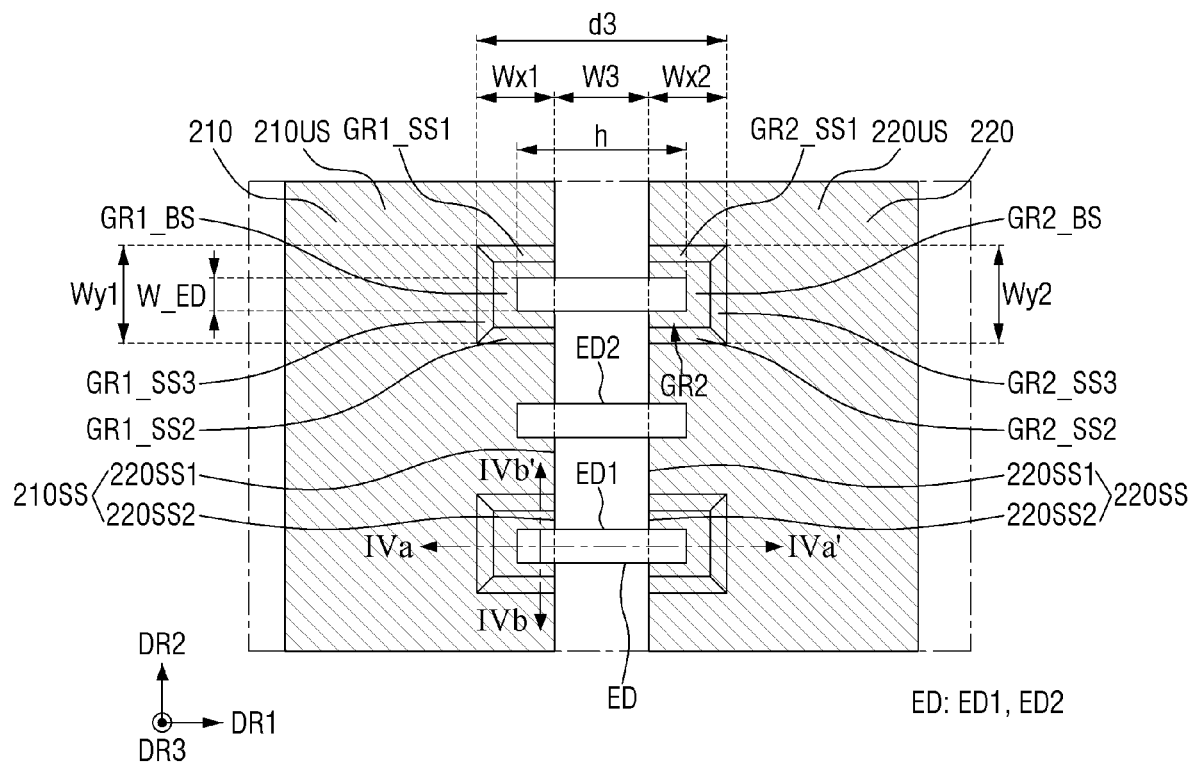
FIG. 15 is a partial plan view schematically illustrating the layout of first and second electrodes, first patterns, second patterns, and light-emitting elements in an emission area of the display device of FIG. 14.
Figure 16:
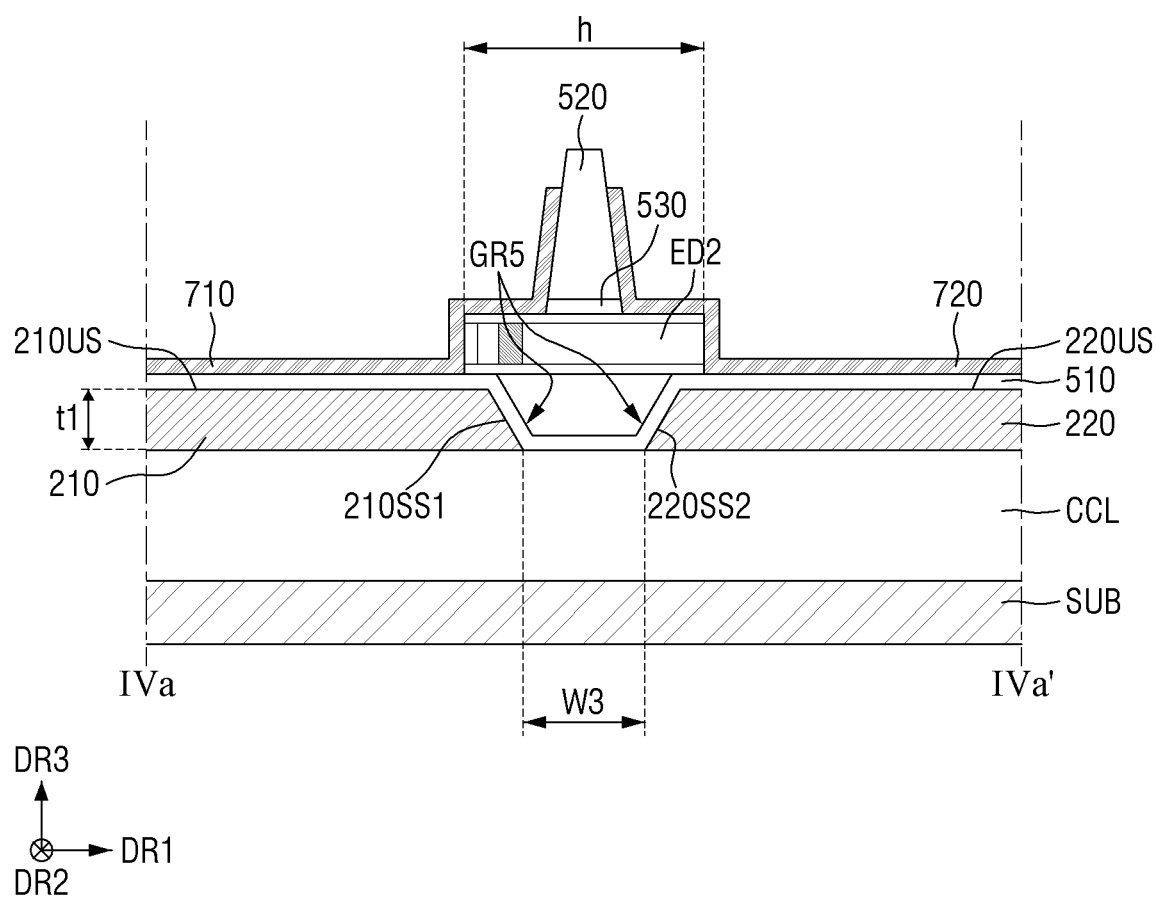
FIG. 16 is a schematic cross-sectional view taken along line IVa-IVa' of FIG. 15.
Figure 17:
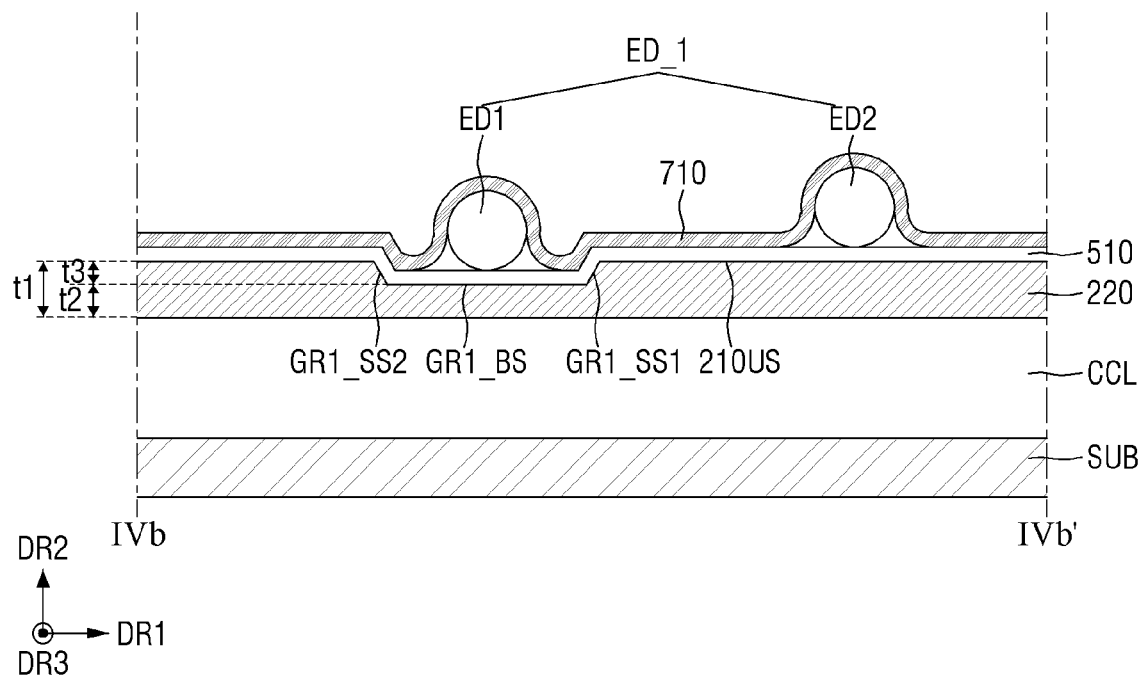
FIG. 17 is a schematic cross-sectional view taken along line IVb-IVb' of FIG. 15.

FIG. 14 is a schematic plan view of a pixel of a display device according to an embodiment. FIG. 15 is a schematic partial plan view illustrating the layout of first and second electrodes, first patterns, second patterns, and light-emitting elements in an emission area of the display device of FIG. 14. FIG. 16 is a schematic cross-sectional view taken along line IVa-IVa' of FIG. 15. FIG. 17 is a schematic cross-sectional view taken along line IVb-IVb' of FIG. 15.

The embodiment of FIGS. 14 to 17 differs from the embodiment of FIG. 2 at least in that a pixel PX_1 includes light-emitting elements ED_1, which include first light-emitting elements ED1 and second light-emitting elements ED2.

Referring to FIGS. 14 to 17, the light-emitting elements ED_1 may include the first light-emitting elements ED1 and the second light-emitting elements ED2. The first light-emitting elements ED1 may be light-emitting elements having both end portions thereof disposed on first patterns GR1 and second patterns GR2, and the second light-emitting elements ED2 may be light-emitting elements having both end portions thereof disposed on top surfaces 210US and 220US of first and second electrodes 210 and 220. The first light-emitting elements ED1 may correspond to the light-emitting elements ED of one of the previous embodiments, and thus, the second light-emitting elements ED will hereinafter be described.

Both end portions of each of the second light-emitting elements ED2 may be disposed on the top surfaces 210US and 220US of the first and second electrodes 210 and 220. As a thickness t1 of parts of the first electrode 210 where the second light-emitting elements ED are disposed is greater a thickness t2 of parts of the second electrode 210 where the first patterns GR1 are formed, the second light-emitting elements ED may be located at a higher level than the first light-emitting elements ED1. The height of the first light-emitting elements ED1 and the height of the second light-emitting elements ED2 may differ by as much as a thickness t3 of the first patterns GR1.

In concluding the detailed description, those skilled in the art will appreciate that many variations and modifications can be made to the embodiments without substantially departing from the principles of the disclosure. Therefore, the disclosed embodiments of the disclosure are used in a generic and descriptive sense only and not for purposes of limitation.

What is claimed is:

1. A display device comprising:
a first electrode disposed on a substrate;
a second electrode disposed on the substrate, the second electrode being spaced apart from, and facing, the first electrode in a first direction; and
light-emitting elements extending in a length direction, each of the light-emitting elements having a first end disposed on the first electrode and a second end disposed on the second electrode, wherein
the first electrode includes first blind grooves extending into each of a top surface of the first electrode to terminate at respective first terminal surfaces of the first electrode and a side surface of the first electrode that faces the second electrode,
the second electrode includes second blind grooves extending into each of a top surface of the second electrode to terminate at respective second terminal surfaces of the second electrode and a side surface of the second electrode that faces the first electrode, and
each of the light-emitting elements does not directly contact the first electrode nor the second electrode.

2. The display device of claim 1, wherein
the first electrode extends in a second direction which intersects the first direction,
the first blind grooves are spaced apart from one another in the second direction,
the second electrode extends in the second direction, and
the second blind grooves are spaced apart from one another in the second direction.

3. The display device of claim 2, wherein
each of the first blind grooves is aligned with and faces a corresponding second blind groove among the second blind grooves.

4. The display device of claim 3, wherein a diameter of each of the light-emitting elements is smaller than a width of each of the first blind grooves in the second direction and a width of each of the second blind grooves in the second direction.

5. The display device of claim 4, wherein the width of each of the first blind grooves in the second direction is equal to a width of a corresponding one of the second blind grooves in the second direction.

6. The display device of claim 3, wherein
a distance between the first blind grooves adjacent in the second direction is uniform, and
a distance between the second blind grooves adjacent in the second direction is uniform.

7. The display device of claim 6, wherein the distance between adjacent first blind grooves among the first blind grooves is equal to the distance between adjacent second blind grooves among the second blind grooves.

8. The display device of claim 2, wherein
a width of each of the first blind grooves in the first direction is smaller than a width of the first electrode in the first direction such that the first blind grooves terminate at respective third terminal surfaces of the first electrode, and
a width of each of the second blind grooves in the first direction is smaller than a width of the second electrode in the first direction such that the second blind grooves terminate at respective fourth terminal surfaces of the second electrode.

9. The display device of claim 1, wherein
each of the first blind grooves includes sidewalls, which extend from the top surface and from the side surface of the first electrode, and by a bottom surface, which extends from the side surface of the first electrode and is connected to the sidewalls of a corresponding one of the first blind grooves,
each of the second blind grooves includes sidewalls, which extend from the top surface and from the side surface of the second electrode, and by a bottom surface, which extends from the side surface of the second electrode and is connected to the sidewalls of a corresponding one of the second blind grooves, and
the sidewalls of each of the first blind grooves face the sidewalls of each of the second blind grooves.

10. The display device of claim 9, wherein
the sidewalls of each of the first blind grooves are inclined with respect to a bottom surface of the corresponding one of the first blind grooves, and
the sidewalls of each of the second blind grooves are inclined with respect to a bottom surface of the corresponding one of the second blind grooves.

11. The display device of claim 9, wherein
the sidewalls of each of the first blind grooves include:
a first sidewall, which extends from the top surface and the side surface of the first electrode,
a second sidewall, which faces the first sidewall of the corresponding one of the first blind grooves, and a third sidewall, which extends from the top surface of the first electrode and connects the first and second sidewalls of the corresponding one of the first blind grooves, the sidewalls of each of the second blind grooves include:
a first sidewall, which extends from the top surface and the side surface of the second electrode,
a second sidewall, which faces the first sidewall of the corresponding one of the second blind grooves, and
a third sidewall, which extends from the top surface of the second electrode and connects the first and second sidewalls of the corresponding one of the second blind grooves, and the third sidewall of each of the first blind grooves are spaced apart from, and face, the third sidewall of each of the second blind grooves in the first direction.

12. The display device of claim 11, wherein a distance between the third sidewall of each of the first blind grooves and the third sidewall of each of the second blind grooves is greater than a length of each of the light-emitting elements in the length direction.

13. The display device of claim 11, wherein
a distance between the first sidewall of each of the first blind grooves and the second sidewall of each of the first blind grooves is greater than a diameter of each of the light-emitting elements, and
a distance between the first sidewall of each of the second blind grooves and the second sidewall of each of the second blind grooves is greater than the diameter of each of the light-emitting elements.

14. The display device of claim 9, wherein
a first end portion of each of the light-emitting elements is disposed on the bottom surface of a respective one of the first blind grooves, and
a second end portion of each of the light-emitting elements is disposed on the bottom surface of a respective one of the second blind grooves.

15. The display device of claim 9, further comprising:
a first insulating layer disposed on the first and second electrodes,
wherein the light-emitting elements are disposed on the first insulating layer.

16. The display device of claim 1, wherein the thickness of each of the first blind grooves and the thickness of each of the second blind grooves are smaller than a diameter of each of the light-emitting elements.

17. The display device of claim 1, wherein the light-emitting elements include first light-emitting elements having first ends disposed on the first blind grooves and second ends disposed on the second blind grooves.

18. The display device of claim 17, wherein the first light-emitting elements are disposed to correspond one-to-one with each of the first blind grooves and the second blind grooves.

19. The display device of claim 17, wherein the light-emitting elements include second light-emitting elements having first ends disposed on the top surface of the first electrode and second ends disposed on the top surface of second electrode.

* * * * *